(12) United States Patent
Khim et al.

(10) Patent No.: US 11,715,699 B2
(45) Date of Patent: Aug. 1, 2023

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Jin Young Khim, Seoul (KR); Won Chul Do, Seoul (KR); Sang Hyoun Lee, Incheon (KR); Ji Hun Yi, Gyeonggi-do (KR); Ji Yeon Ryu, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 16/821,899

(22) Filed: Mar. 17, 2020

(65) Prior Publication Data
US 2021/0296248 A1 Sep. 23, 2021

(51) Int. Cl.
*H01L 23/538* (2006.01)
*H01L 23/00* (2006.01)
*H01L 21/683* (2006.01)
*H01L 21/48* (2006.01)
*H01L 21/56* (2006.01)
(Continued)

(52) U.S. Cl.
CPC ...... *H01L 23/5389* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/6835* (2013.01); *H01L 21/78* (2013.01); *H01L 23/3128* (2013.01); *H01L 23/5383* (2013.01); *H01L 23/5386* (2013.01); *H01L 24/19* (2013.01); *H01L 24/20* (2013.01);
(Continued)

(58) Field of Classification Search
CPC ............. H01L 23/5389; H01L 21/4857; H01L 21/561; H01L 21/565; H01L 21/568; H01L 24/19; H01L 21/6835; H01L 21/78; H01L 24/20; H01L 23/3128; H01L 21/4853; H01L 23/5386; H01L 23/5383; H01L 2221/68372; H01L 2224/214
USPC ....................................................... 257/668
See application file for complete search history.

(56) References Cited

U.S. PATENT DOCUMENTS 6,897,506 B2 5/2005 Brocklin et al.
8,084,850 B2 12/2011 Shin
(Continued)

*Primary Examiner* — Vu A Vu
(74) *Attorney, Agent, or Firm* — Spectrum IP Law Group LLC

(57) ABSTRACT

In one example, a semiconductor device, comprises a first redistribution layer (RDL) substrate comprising a first dielectric structure and a first conductive structure through the first dielectric structure and comprising one or more first conductive redistribution layers, an electronic component over the first RDL substrate, wherein the electronic component is coupled with the first conductive structure, a body over a top side of the first RDL substrate, wherein the electronic component is in the body, a second RDL substrate comprising a second dielectric structure over the body, and a second conductive structure through the second dielectric structure and comprising one or more second conductive redistribution layers, and an internal interconnect coupled between the first conductive structure and the second conductive structure. Other examples and related methods are also disclosed herein.

20 Claims, 39 Drawing Sheets

(51) Int. Cl.
*H01L 21/78* (2006.01)
*H01L 23/31* (2006.01)

(52) U.S. Cl.
CPC ............... *H01L 2221/68372* (2013.01); *H01L 2224/214* (2013.01)

(56) References Cited

U.S. PATENT DOCUMENTS

| | | |
|---|---|---|
| 8,669,651 B2 | 3/2014 | Yang et al. |
| 8,669,653 B2 | 3/2014 | Oi |
| 8,692,135 B2 | 4/2014 | Funaya et al. |
| 9,137,900 B2 * | 9/2015 | Tanaka .................... H01L 24/97 |
| 9,269,687 B2 * | 2/2016 | Chen ..................... H01L 25/105 |
| 9,462,697 B2 | 10/2016 | Chung et al. |
| 9,484,327 B2 | 11/2016 | Kim et al. |
| 9,768,155 B2 * | 9/2017 | Lin ....................... H01L 25/105 |
| 9,941,207 B2 * | 4/2018 | Lin ....................... H01L 23/528 |
| 10,049,964 B2 * | 8/2018 | Shim, II ................ H01L 25/105 |
| 10,170,409 B2 | 1/2019 | Ganesan et al. |
| 10,319,607 B2 | 6/2019 | Wu et al. |
| 10,325,855 B2 | 6/2019 | Kim et al. |
| 10,784,220 B2 | 9/2020 | Jeng et al. |
| 10,797,039 B2 * | 10/2020 | Yang ..................... H01L 25/16 |
| 11,152,309 B2 | 10/2021 | Suk |
| 11,562,964 B2 | 1/2023 | Khim et al. |
| 2009/0008765 A1 * | 1/2009 | Yamano ................ H01L 25/162 |
| | | 257/E23.125 |
| 2010/0327419 A1 | 12/2010 | Muthukumar et al. |
| 2011/0175235 A1 * | 7/2011 | Horiuchi ........... H01L 23/49811 |
| | | 257/774 |
| 2014/0063768 A1 * | 3/2014 | Tanaka .................... H05K 1/185 |
| | | 29/830 |
| 2018/0204820 A1 * | 7/2018 | Zhai .................... H01L 23/3135 |

\* cited by examiner

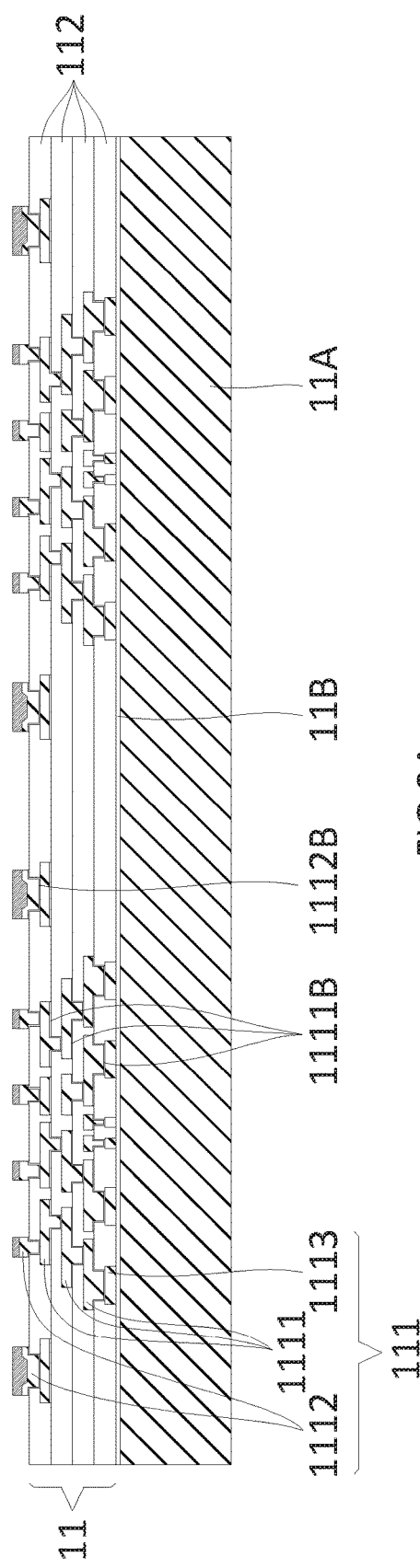
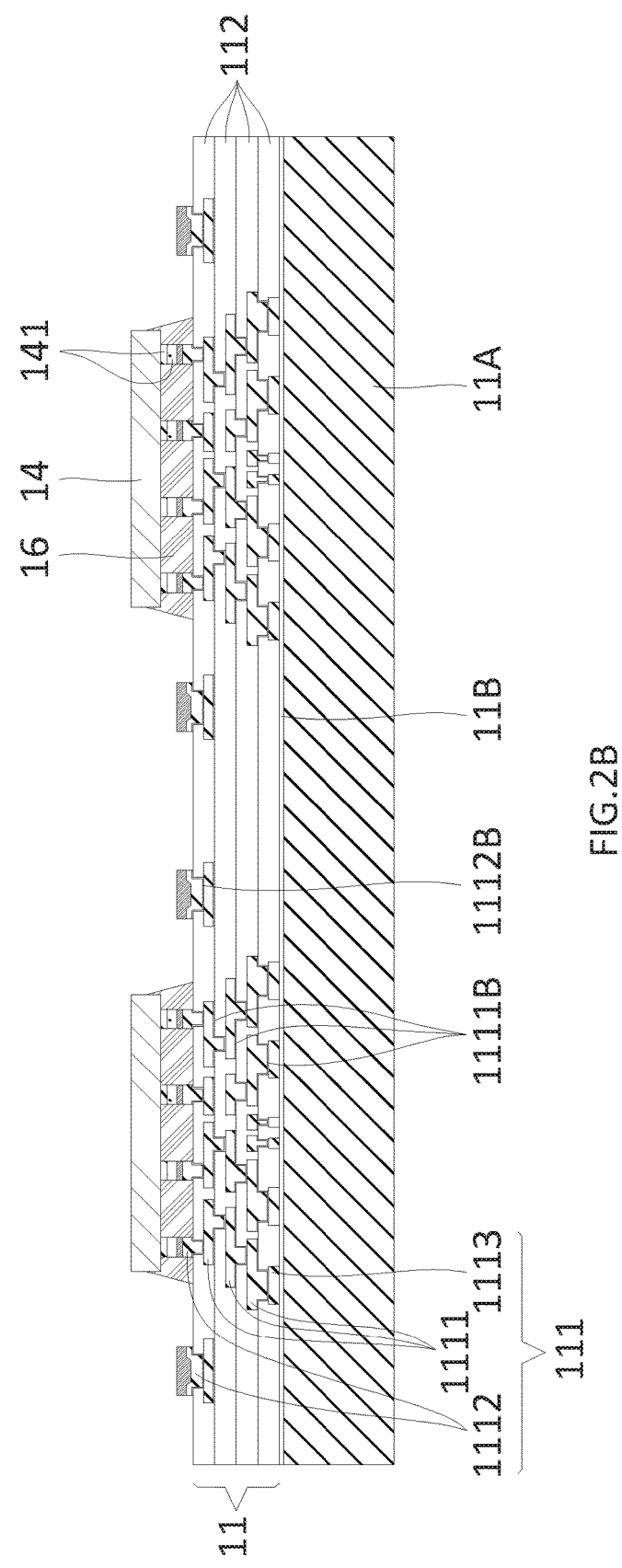

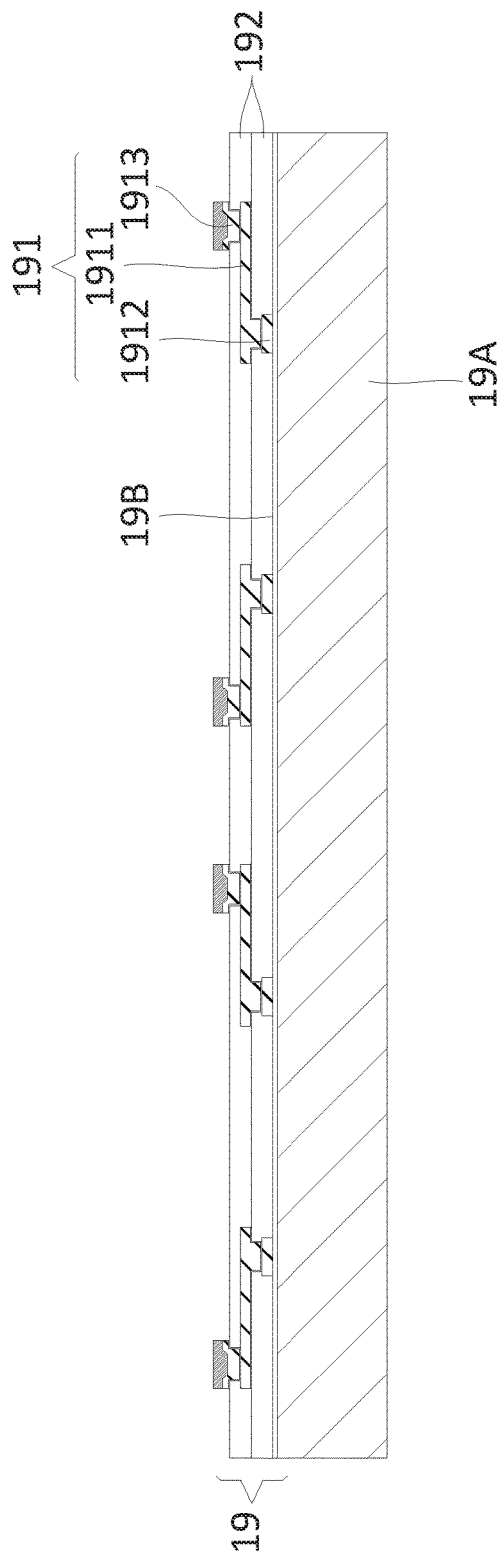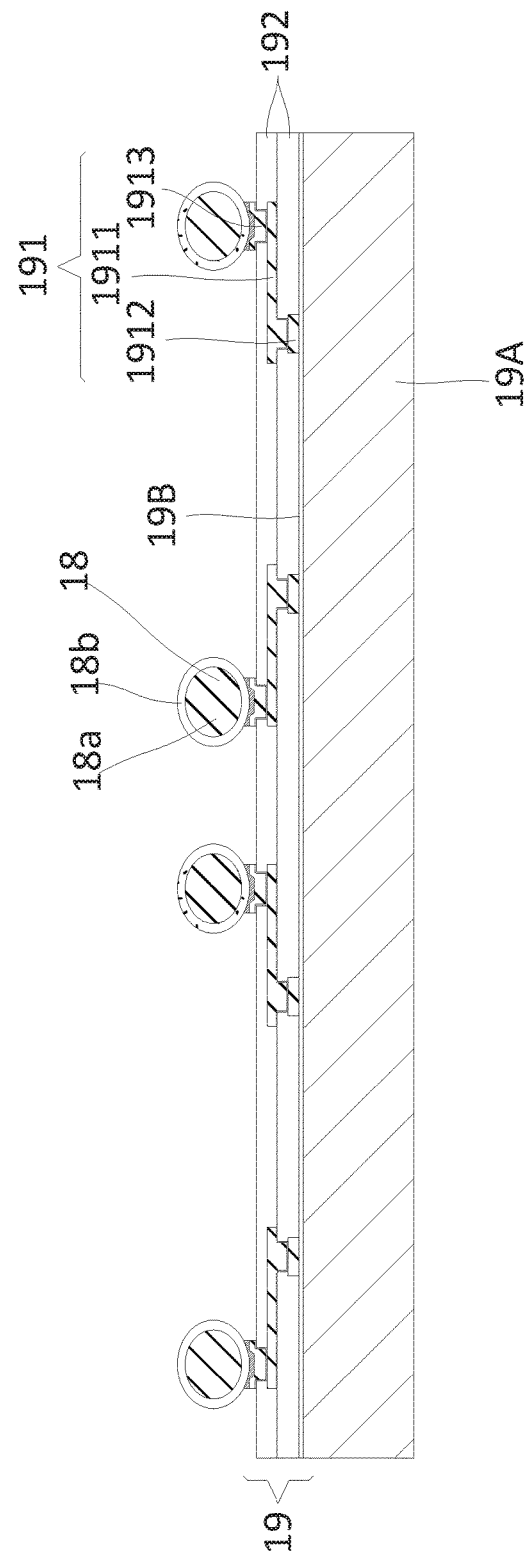

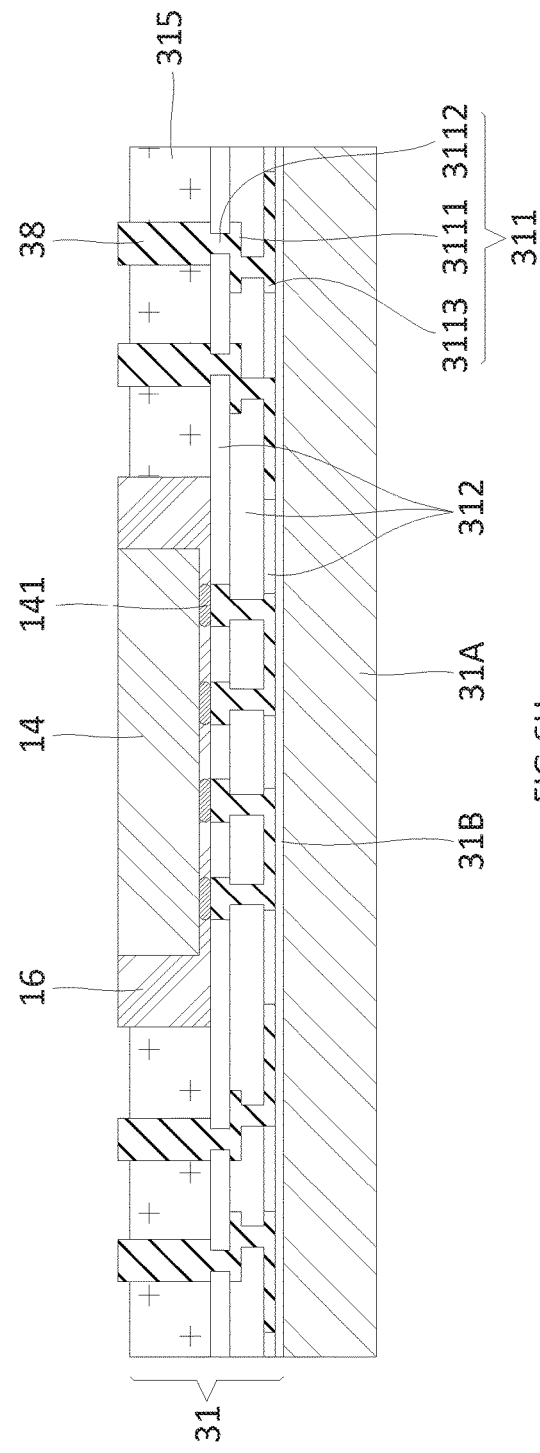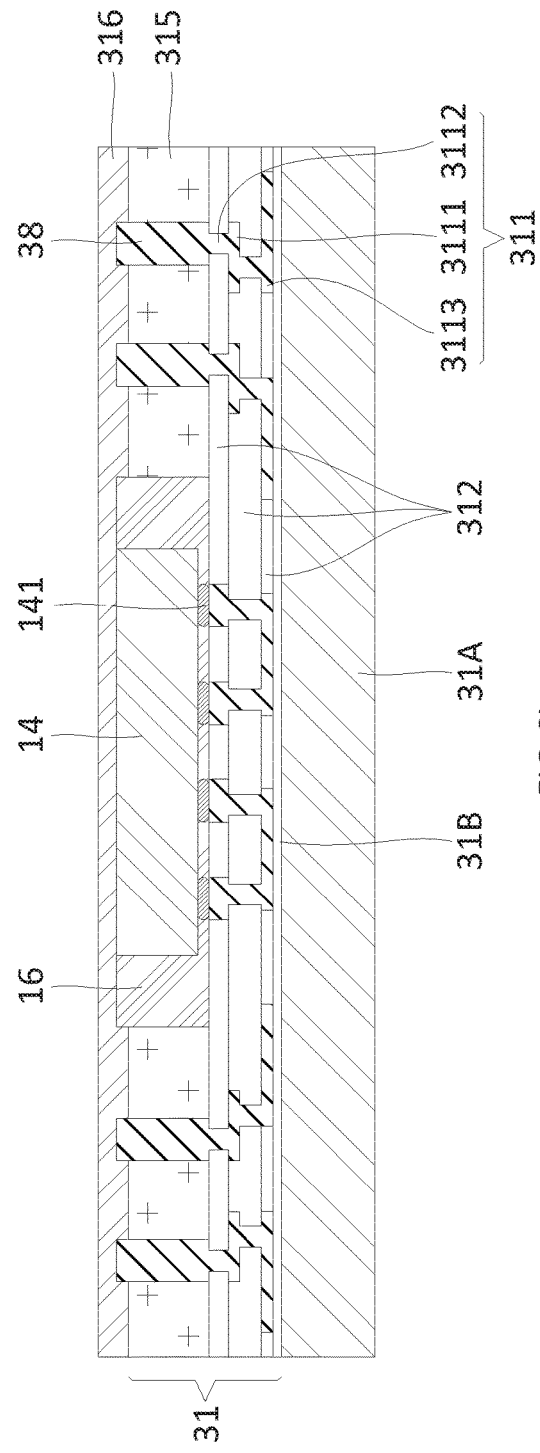

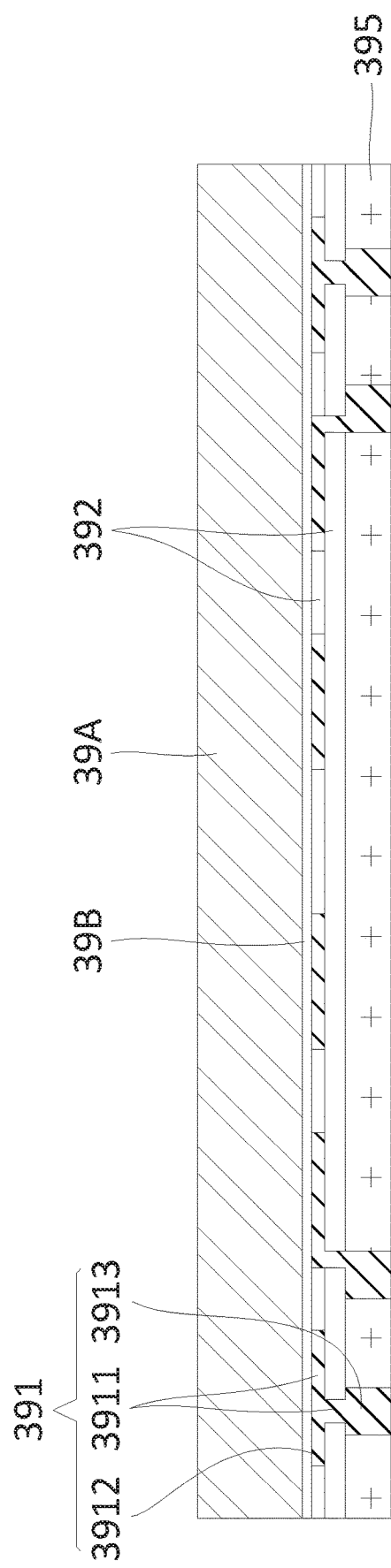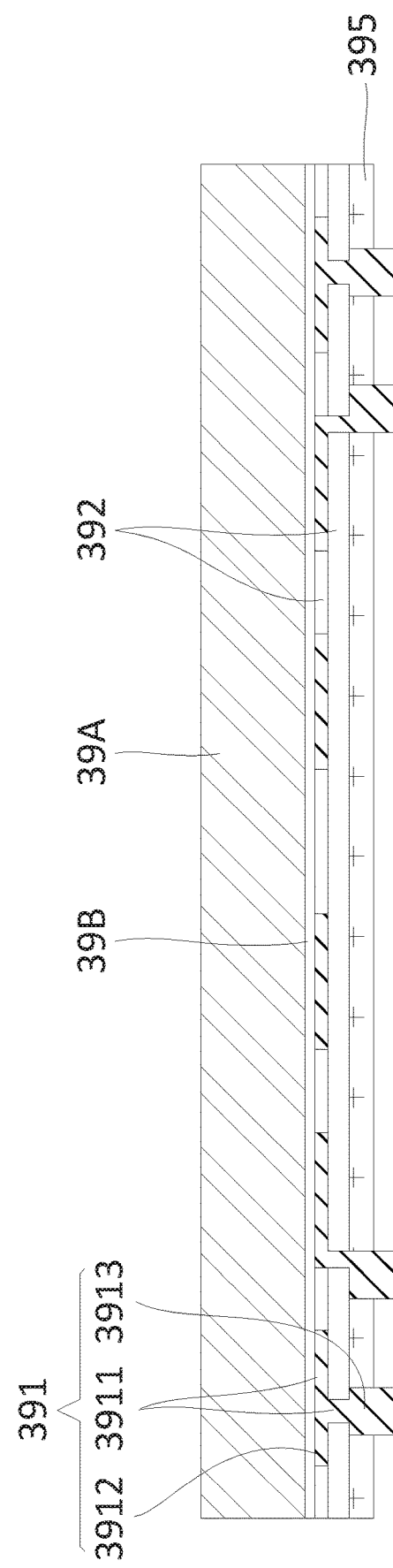

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2L show cross-sectional views of an example method for manufacturing an example semiconductor device.

Figure 1:
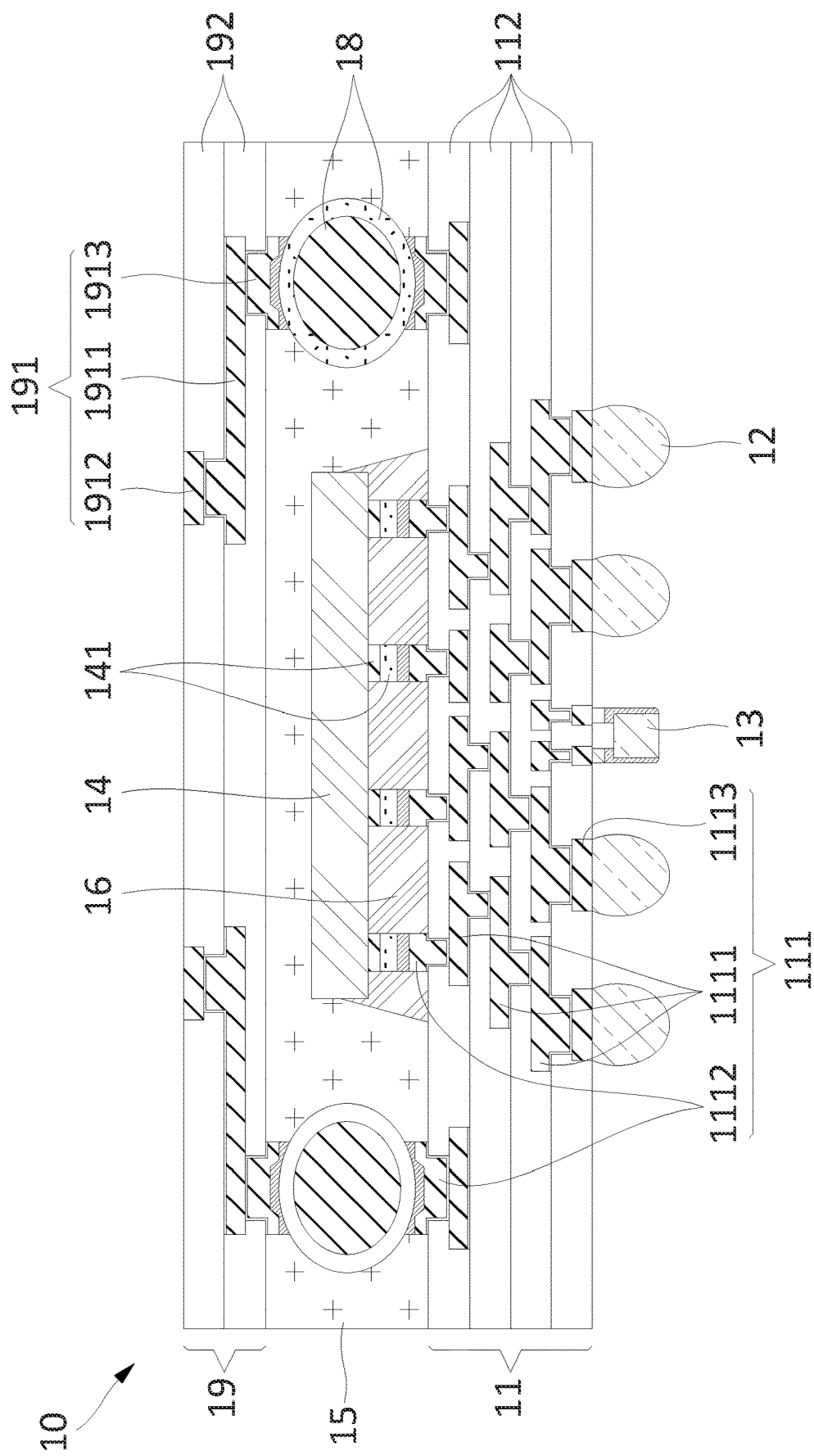
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help increase understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to or with element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device, comprises a first redistribution layer (RDL) substrate comprising a first dielectric structure and a first conductive structure through the first dielectric structure and comprising one or more first conductive redistribution layers, an electronic component over the first RDL substrate, wherein the electronic component is coupled with the first conductive structure, a body over a top side of the first RDL substrate, wherein the electronic component is in the body, a second RDL substrate comprising a second dielectric structure over the body, and a second conductive structure through the second dielectric structure and comprising one or more second conductive redistribution layers, and an internal interconnect coupled between the first conductive structure and the second conductive structure.

In another example, method to manufacture a semiconductor device, comprises providing a bottom substrate on a bottom carrier, wherein the bottom substrate comprises a first dielectric structure, a first conductive structure, and a top interconnect at a first side of the bottom substrate, providing an electronic component over the bottom substrate, wherein the electronic component is coupled with the first conductive structure, providing a top substrate on a top carrier, wherein the top substrate comprises a second dielectric structure, a second conductive structure, and a bottom interconnect on a first side of the top substrate, providing an internal interconnect coupled with one of the top interconnect of the bottom substrate or the bottom interconnect of the top substrate, providing the top substrate over the bottom substrate, wherein the top substrate is inverted with respect to the bottom substrate, coupling the internal interconnect to another one of the top interconnect of the bottom substrate or the bottom interconnect of the top substrate, providing a body between the bottom substrate and the top substrate, wherein the electronic component is in the body, removing the top carrier and the bottom carrier, and singulating through the top substrate, the bottom substrate, and the body.

In an additional example, a method to manufacture a semiconductor device, comprises providing a bottom substrate on a bottom carrier, wherein the bottom substrate comprises a first dielectric structure, a first conductive structure, and a top interconnect at a first side of the bottom substrate, providing an electronic component over the bottom substrate, wherein the electronic component is coupled with the first conductive structure, providing a top substrate on a top carrier, wherein the top substrate comprises a second dielectric structure, a second conductive structure, and a bottom interconnect on a first side of the top substrate, providing an internal interconnect coupled with one of the top interconnect of the bottom substrate or the bottom interconnect of the top substrate, singulating through the top substrate and the top carrier to define a first top substrate unit, providing the first top substrate unit over the electronic component and over the bottom substrate, coupling the internal interconnect with another one of the top interconnect of the bottom substrate or the bottom interconnect of the top substrate, providing a body between the bottom substrate and the first top substrate unit, wherein the electronic component is in the body, and wherein the body covers a periphery of the first top substrate unit, removing the top carrier and the bottom carrier, and singulating the first top substrate unit, the bottom substrate, and the body.

Other examples are included in the present disclosure. Such examples may be found in the figures, in the claims, or in the description of the present disclosure.

FIG. 1 shows a cross-sectional view of an example semiconductor device 10. In the example shown in FIG. 1, semiconductor device 10 can comprise bottom substrate 11, external interconnects 12, electronic component 14, body 15, underfill 16, internal interconnects 18 and top substrate 19. In some examples, semiconductor device 10 can further comprise electronic component 13 under bottom substrate 11.

Bottom substrate 11 can comprise conductive structure 111 comprising conductive paths 1111, top interconnects 1112 and bottom interconnects 1113, and dielectric structure 112. Electronic component 14 can comprise device interconnects 141. Top substrate 19 can comprise conductive structure 191 comprising conductive paths 1911, top interconnects 1912 and bottom interconnects 1913, and dielectric structure 192. In some examples, multiple electronic components 14 can be coupled between bottom substrate 11 and top substrate 19. In some examples, multiple electronic components 13 can be coupled at the bottom of bottom substrate 11. In some examples, electronic component 13 can comprise or represent one or more active components or passive components. In some examples, electronic component 14 can comprise or represent one or more passive components or active components or can be similar to electronic component 13.

Bottom substrate 11, external interconnects 12, underfill 16, internal interconnects 18 and top substrate 19 can be referred to as a semiconductor package which can protect electronic component 14 from external elements or environmental exposure. In some examples, semiconductor package can provide electrical coupling between external device and external interconnects. In some examples, dielectric structure 112 or dielectric structure 192 can be coreless.

Figure 2E:
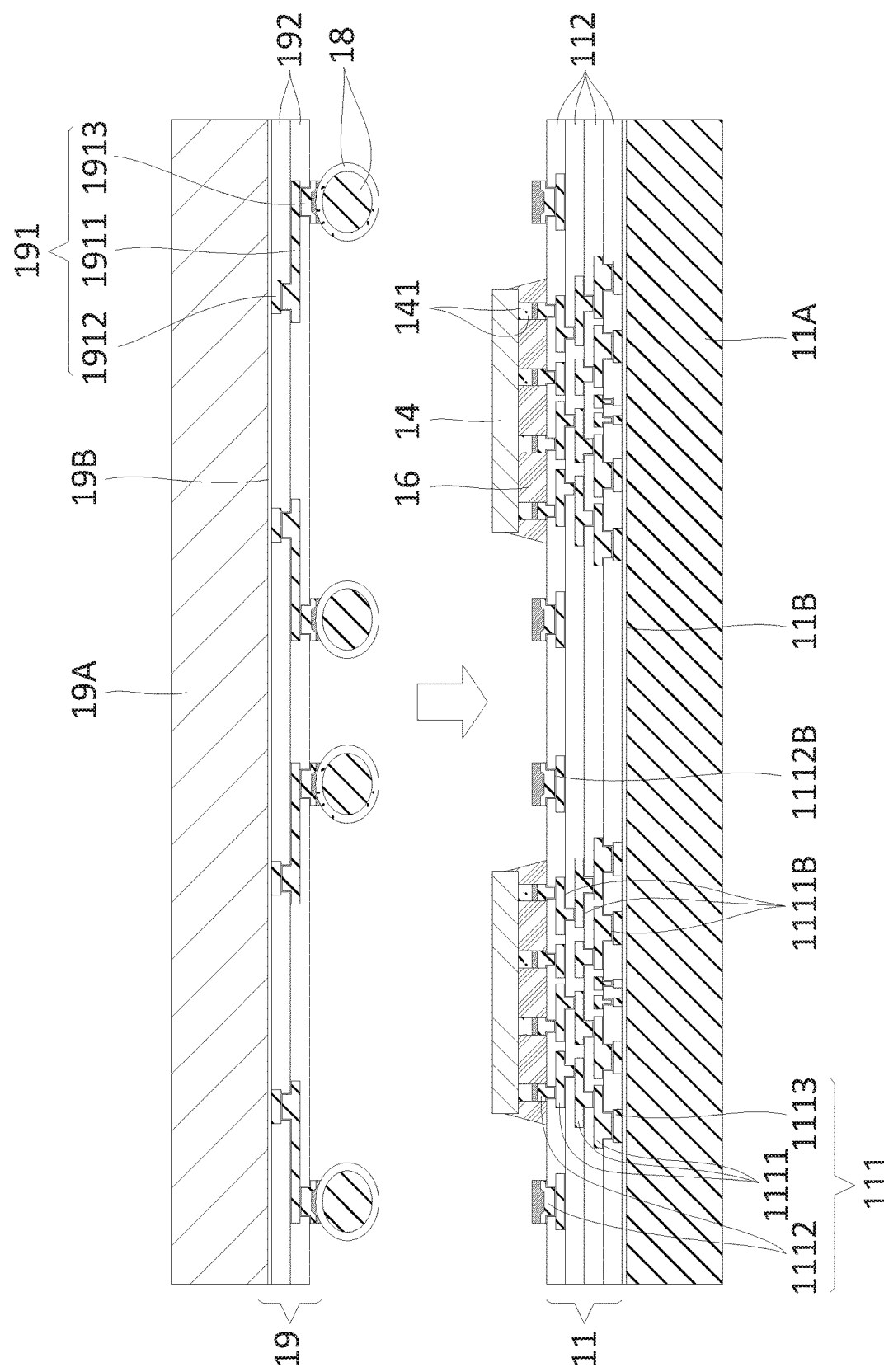

FIGS. 2A to 2L show cross-sectional views of an example method for manufacturing semiconductor device 10. FIG. 2A shows a cross-sectional view of semiconductor device 10 at an early stage of manufacture.

In the example shown in FIG. 2A, bottom substrate 11 can be provided on bottom carrier 11A. In some examples, bottom carrier 11A can comprise or can be referred to as a circular wafer or a rectangular panel. In some examples, bottom carrier 11A can comprise a silicon, glass, ceramic, or metal material. In some examples, bottom substrate 11 can be formed on bottom carrier 11A, or can be pre-formed and then coupled with bottom carrier 11A.

Seed layer 11B can be located on bottom carrier 11A. In some examples, seed layer 11B can be deposited, such as by sputtering or spraying. In some examples, a titanium tungsten (TiW) sublayer can first be deposited, and a copper (Cu) sublayer can then be deposited on the TiW sublayer to define seed layer 11B. Seed layer 11B can have a thickness in the range from approximately 0.1 μm to approximately 1 μm. Seed layer 11B can allow an electrical base on which conductive structure 111 can be formed, such as by plating.

In some examples, a temporary adhesive can be located on bottom carrier 11A, and seed layer 11B can be formed on the temporary adhesive. The temporary adhesive can be configured to be releasable by heat or light to allow bottom carrier 11A to be removed from bottom substrate 11 in a subsequent process.

Dielectric structure 112 can comprise one or more dielectric layers and can be deposited on seed layer 11B. In some examples, dielectric structure 112 can be provided using a spin coating process or a spray coating process or can be applied as a pre-formed film. In some examples, dielectric structure 112 can comprise or can be referred to as polyimide (PI), benzocyclobutane (BCB), or polybenzoxazole (PBO). Dielectric structure 112 can have a thickness in the range from approximately 2 μm to approximately 20 μm.

In some examples, a patterned mask can be positioned on dielectric structure 112 and light can be irradiated into the patterned mask to pattern dielectric structure 112. In some examples, such a photolithography process can be performed using stepper equipment. As patterned portions or non-patterned portions of dielectric structure 112 are developed, dielectric structure 112 can comprise openings. Dielectric structure 112 having openings can be used as the mask to expose a region of seed layer 11B through the openings of dielectric structure 112. With portions of seed layer 11B exposed through openings of dielectric structure 112, current can be supplied via seed layer 11B for an electroplating in the openings of dielectric structure 112.

Conductive structure 111, for example bottom interconnects 1113, can be formed on seed layer 11B positioned inside the openings of dielectric structure 112. Bottom interconnects 1113 can comprise or can be referred to as pads, lands, Under Bumped Metallizations (UBMs), or pillars. In some examples, bottom interconnects 1113 can be provided by plating copper (Cu) or nickel (Ni), sequentially plating gold (Au) and copper (Cu), or sequentially plating gold (Au) and nickel (Ni), on the exposed portions of seed layer 11B and into the openings of dielectric structure 112. Bottom interconnects 1113 can have a line/space/thickness in the range from approximately 0.5/0.5/0.5 micrometers (μm) to approximately 10/10/10 μm. In some examples, bottom interconnects 1113 can be provided using electroplating equipment containing a copper (Cu) solution, a nickel (Ni) solution, or a gold (Au) solution. In a subsequent process, external interconnects 12 can be connected to bottom interconnects 1113.

Further seed layers 11B, conductive paths 1111 and top interconnects 1112 of conductive structure 111, and dielectric layers of dielectric structure 112, can be provided in a similar manner to that described above. Conductive paths 1111 can comprise or can be referred to as patterns, traces, or vias. In some examples, a conductive path 1111 can comprise a metallic layer that defines a sibling trace and via, with the via extending from the trace as part of the same metallic layer. In the present example, the vias of conductive paths 1111 are shown as downward vias in that they are positioned below their respective sibling traces or extend downward from their respective sibling traces towards the bottom of bottom substrate 11 or the bottom of semiconductor device 10.

Conductive paths 1111 can be generally positioned inside dielectric structure 112, between respective dielectric layers of dielectric structure 112. Top interconnects 1112 can comprise or can be referred to as pads, lands, Under Bumped Metallizations (UBMs), vias, downward vias, or pillars. In some examples, top interconnects 1112 can protrude from dielectric structure 112. Conductive paths 1111 can electrically connect bottom interconnects 1113 with top interconnects 1112, and top interconnects 1112 can electrically connect electronic component 14 with conductive paths 1111. In some examples, a bonding material, for example solder or gold, can be further located on top interconnects 1112. In some examples, a stencil having openings corresponding to top interconnects 1112 can be positioned, solder paste can be positioned on the stencil, and a predetermined amount of solder paste can then be positioned on top interconnects 1112 by a subsequent squeezing process using a blade. In some examples, solder can be plated on top interconnects 1112 followed by reflowing. In some examples, more or fewer layers of conductive structure 111 or of dielectric structure 112 can be provided.

Bottom substrate 11 can comprise multiple units located on a single bottom carrier 11A. In some examples, multiple bottom substrate 11 units can be located on one single bottom carrier 11A in the form of strips or arrays to increase production efficiency of semiconductor device 10.

In the present example, bottom substrate 11 is presented as a redistribution layer ("RDL") substrate. RDL substrates can comprise one or more conductive redistribution layers and one or more dielectric layers that (a) can be formed layer by layer over an electronic device to which the RDL substrate is to be electrically coupled, or (b) can be formed layer by layer over a carrier that can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material, for example copper or other plateable metal. The locations of the conductive patterns can be made using a photo-patterning process such as a photolithography process and a photoresist material to form a photolithographic mask. The dielectric layers of the RDL substrate can be patterned with a photo-patterning process which can include a photolithographic mask through which light is exposed to photo-pattern desired features such as vias in the dielectric layers. Thus, the dielectric layers can be made from photo-definable organic dielectric materials, for example polyimide (PI), benzocyclobutene (BCB), or polybenzoxazole (PBO). Such dielectric materials can be spun-on or otherwise coated in liquid form rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

In some examples, bottom substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process.

In some examples, as shown in FIG. 2A, bottom substrate 11 can comprise a an RDL substrate comprising a dielectric structure 112 and a conductive structure 111 through the dielectric structure 112. Conductive structure 111 can comprise conductive paths 1111 comprising one or more conductive redistribution layers.

FIG. 2B shows a cross-sectional view of semiconductor device 10 at another stage of manufacture. In the example shown in FIG. 2B, electronic component 14 can be positioned over bottom substrate 11. In some examples, electronic component 14 can be coupled with top interconnects 1112 of bottom substrate 11. In some examples, electronic component 14 can be coupled with the first conductive structure 111. In some examples, electronic component 14 can comprise or can be referred to as a chip, a die, or a package. The chip or die can comprise an integrated circuit singulated from a semiconductor wafer. In some examples, electronic component 14 can comprise a digital signal processor (DSP), a network processor, a power management unit, an audio processor, a radio-frequency (RF) circuit, a wireless baseband system on chip (SoC) processor, a sensor, or an application specific integrated circuit (ASIC). In some examples, electronic component 14 can comprise a passive component such as one or more resistors, capacitors, or inductors. Electronic component 14 can have a thickness in the range from approximately 20 µm to approximately 300 µm.

Electronic component 14 can comprise device interconnects 141 that can be coupled with top interconnects 1112. In some examples, device interconnects 141 can comprise or can be referred to as pads, pillars, or bumps. In some examples, device interconnects 141 can be connected to top interconnects 1112 through bonding materials. In some examples, electronic component 14 can be coupled with top interconnects 1112 using a mass reflow process, a thermal compression process, or a laser assist bonding process. In addition, device interconnects 141 can have a thickness in the range from approximately 1 µm to approximately 50 µm.

In some examples, underfill 16 can be positioned between bottom substrate 11 and electronic component 14. In some examples, underfill 16 can be injected or absorbed into a gap between electronic component 14 and bottom substrate 11 after electronic component 14 is coupled with bottom substrate 11. In some examples, underfill 16 can be coated on bottom substrate 11 in advance before electronic component 14 is connected to bottom substrate 11. Accordingly, device interconnects 141 can pass through underfill 16 to then be coupled with bottom substrate 11 at the same time when electronic component 14 presses underfill 16. In some examples, a curing process can be further performed on underfill 16. In some cases, when an inorganic filler of body 15 has a smaller size than the gap between electronic component 14 and bottom substrate 11, underfill 16 can comprise a portion of body 15 that extends into the gap, or the processes associated with underfill 16, for example filling, injecting, coating, or curing, can be omitted.

FIG. 2C shows a cross-sectional view of semiconductor device 10 at another stage of manufacture. In the example shown in FIG. 2C, top substrate 19 can be formed or positioned over top carrier 19A using seed layer 19B. In some examples, top carrier 19A can be similar to bottom carrier 11A. In some examples, top substrate 19 can be similar to bottom substrate 11 in terms of materials, structure, or method of manufacture. Top substrate 19 can comprise conductive structure 191 with conductive paths 1911, top interconnects 1912, or bottom interconnects 1913, which can be similar to conductive structure 111 with respective conductive paths 1111, top interconnects 1112, or bottom interconnects 1113. Top substrate 19 can comprise dielectric structure 192 with one or more dielectric layers, similar to dielectric structure 112. In some examples, the number of layers of top substrate 19 shown in FIG. 2C can be smaller than, equal to or greater than the number of layers of bottom substrate 11 shown in FIG. 2A. Top substrate 19 can comprise multiple units located on one single top carrier 19A. In some examples, multiple top substrate 19 units can be located on one single top carrier 19A in forms of strips or arrays to enhance production efficiency of semiconductor device 10.

FIG. 2D shows a cross-sectional view of semiconductor device 10 at a later stage of manufacture. In the example shown in FIG. 2D, internal interconnects 18 can be positioned on top substrate 19. In some examples, internal interconnects 18 can be connected to bottom interconnects 1913 through a bonding material. Internal interconnects 18 can comprise or can be referred to as metallic-core balls, pillars, or solder balls. In the case of metallic-core balls, interconnects 18 can comprise a metallic core 18a surrounded by solder coating 18b, where metallic core 18a can comprise copper or other metal with higher melting point than solder coating 18b. Internal interconnects 18 can have a diameter in the range from approximately 50 µm to approximately 300 µm. Internal interconnects 18 can electrically connect bottom substrate 11 and top substrate 19 to each other in finalized semiconductor device 10. In some examples, internal interconnects 18 can be located on top interconnects 1112 of bottom substrate 11, rather than top substrate 19.

In some examples, processes shown in FIGS. 2A and 2B can be performed and processes shown in FIGS. 2C and 2D can then be performed. In some examples, processes shown in FIGS. 2C and 2D can be performed and processes shown in FIGS. 2A and 2B can then be performed. In some examples, processes shown in FIGS. 2A and 2B and processes shown in FIGS. 2C and 2D can be simultaneously performed.

Figure 2F:
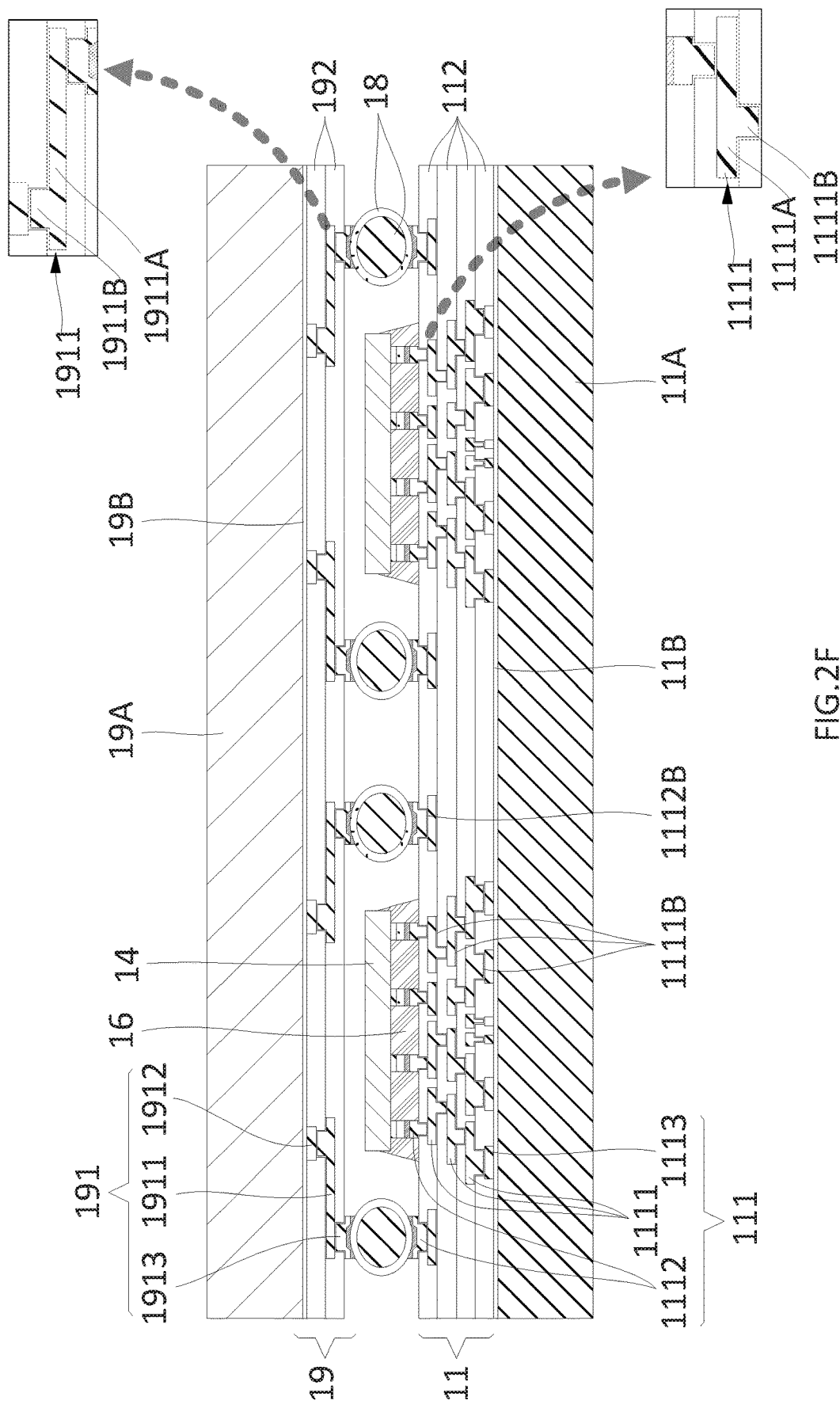

FIGS. 2E and 2F show a cross-sectional view of semiconductor device 10 at a later stage of manufacture. In the example shown in FIGS. 2E and 2F, top substrate 19 and bottom substrate 11 can be coupled to each other. In some examples, internal interconnects 18 previously connected to bottom interconnects 1913 of top substrate 19 can be coupled with top interconnects 1112 of bottom substrate 11. In some examples, internal interconnects 18 previously connected to top interconnects 1112 of bottom substrate 11 can be coupled with bottom interconnects 1913 of top substrate 19. In some examples, internal interconnect 18 can be provided between top substrate 19 and bottom substrate 11, and can be coupled with one of top interconnect 1112 of bottom substrate 11, or bottom interconnect 1913 of top substrate 19, before top substrate 19 and bottom substrate 11 are brought together. After substrates 19 and 11 are brought together, internal interconnects 18 coupled with top or bottom interconnects of one substrate can be coupled with corresponding bottom or top interconnects of the other substrate. In some examples, top substrate 19 and bottom substrate 11 having internal interconnects 18 located in between can be coupled with each other using a mass reflow process, a thermal compression process, or a laser assist bonding process. In some examples, a gap can exist between electronic component 14 and top substrate 19. In some examples, the top of electronic component 14 can contact the bottom of top substrate 19.

In some examples, top substrate 19 can be provided over bottom substrate 11, with the top substrate 19 being inverted with respect to bottom substrate 11. With substrates 19 and 11 coupled to each other, relative orientations of their respective features or layers, such as conductive structures 191 and 111, can be appreciated. In some examples, conductive structure 191 is first built layer by layer on carrier 19A (FIGS. 2C-2D) and is then flipped before coupling over bottom substrate 11 (FIGS. 2E-2F). Accordingly, the orientations of features of conductive structures 191 and 111 can be considered inverted relative to each other. For instance, a conductive path 1111 of conductive structure 111 can comprise sibling trace 1111A and via 1111B, with via 1111B extending from trace 1111A as part of a same metallic layer. Similarly, a conductive path 1911 of conductive structure 191 can comprise sibling trace 1911A and via 1911B, with via 1911B extending from trace 1911A as part of a same metallic layer. In the present example, vias 1111B of conductive paths 1111 can be referred as downward vias, in that they are positioned below or extend downward from their respective sibling traces 1111A towards the bottom of semiconductor device 10. Conversely, vias 1911B of conductive paths 1911 can be referred as upward vias, in that they are positioned above or extend upward from their respective sibling traces 1911A towards the top of semiconductor device 10. In some examples, conductive structure 111 comprises conductive path 1111 comprising trace 1111A and downward via 1111B. In some examples, the conductive structure 191 comprises conductive path 1911 comprising trace 1911A and upward via 1911B.

Multiple bottom substrate 11 units arrayed on bottom carrier 11A can be simultaneously coupled to respective multiple top substrate 19 units arrayed on top carrier 19A, while still attached to their respective carriers 11 or 19. Such processing permits economies of time and cost by avoiding the need to individually couple substrates 11 with substrates 19 one at a time. In some examples, such simultaneous coupling can be carried out as a Panel-Level process, where carriers 11 or 19 can comprise larger area rectangular panels that can accommodate simultaneous coupling of further respective substrates 11 or 19 than possible with wafer-level or strip-level processes.

Figure 2G:
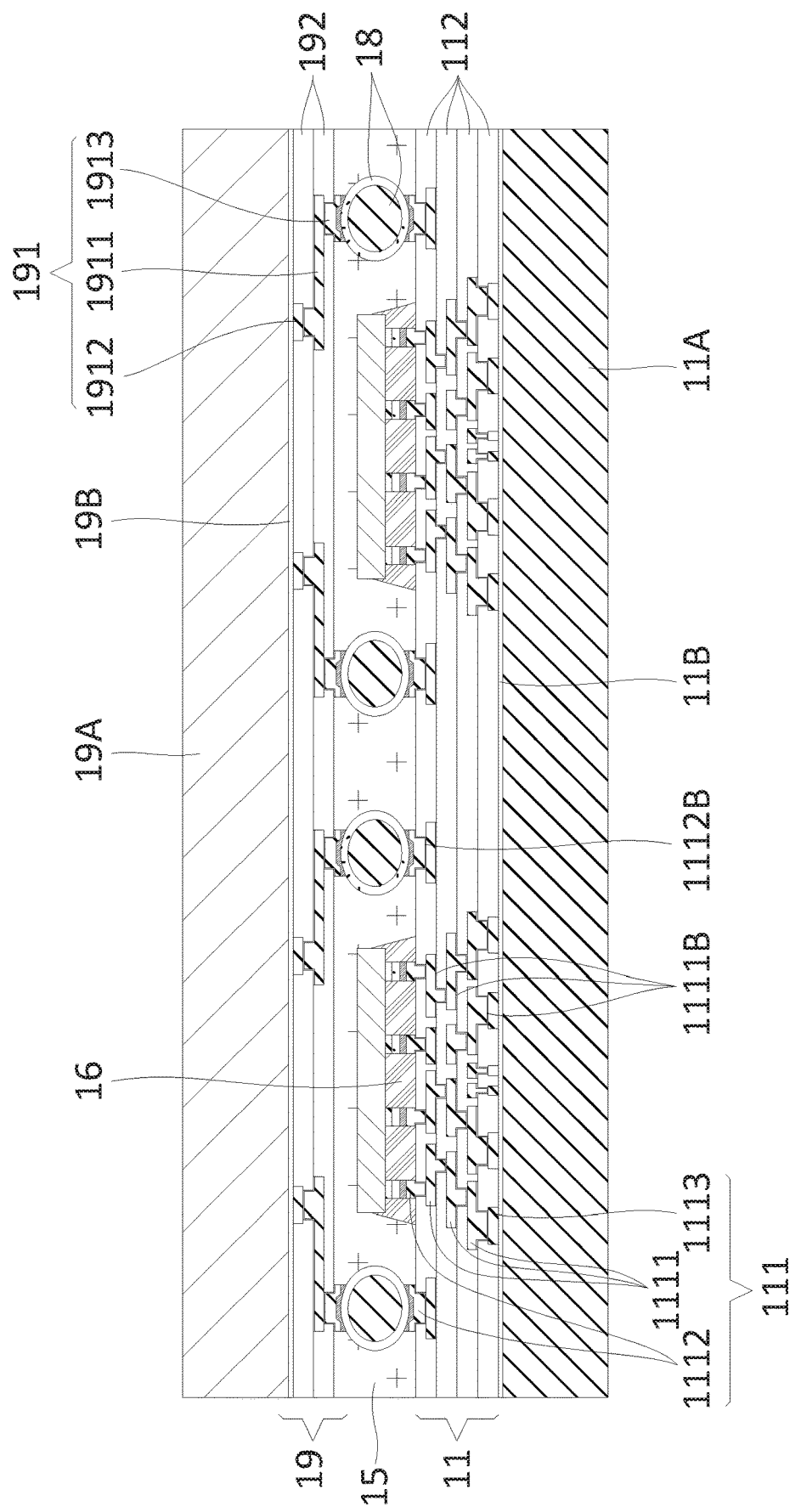

FIG. 2G shows a cross-sectional view of semiconductor device 10 at a later stage of manufacture. In the example shown in FIG. 2G, insulating body 15 can be located between top substrate 19 and bottom substrate 11. Body 15 can be over a top side of bottom substrate 11. In some examples, electronic component 14 can be in body 15 or can be at least partially surrounded by body 15. Body 15 can comprise or can be referred to as an encapsulant, a mold compound, a resin, or a sealant. In some examples, body 15 can comprise an organic material having inorganic filler particles such as silica. In some examples, body 15 can be injected or provided using a transfer molding process. Accordingly, body 15 can fill a space existing between top substrate 19 and bottom substrate 11. In some examples, body 15 can be adhered to the bottom of top substrate 19 and the top of bottom substrate 11 while covering lateral sides of electronic component 14 and internal interconnects 18. Underfill 16 can be between electronic component 14 and the top side of bottom substrate 11. If underfill 16 is provided separately, body 15 can cover exposed portions of underfill 16 as well. In some examples, body 15 can also cover a gap existing between electronic component 14 and top substrate 19. For example, body 15 can extend between a bottom side of the top substrate 19, and a top side of electronic component 14. When top side of electronic component 14 and bottom side of top substrate 19 are brought into close contact with each other, body 15 can be omitted between the top of electronic component 14 and the bottom of top substrate 19.

In some examples, top substrate 19 can comprise a dielectric structure 192 over body 15, and conductive structure 191 through dielectric structure 192. Conductive structure 191 can comprise conductive paths 1911 which comprise one or more conductive redistribution layers. Internal interconnect 18 can be coupled between conductive structure 111 and conductive structure 191.

Figure 2H:
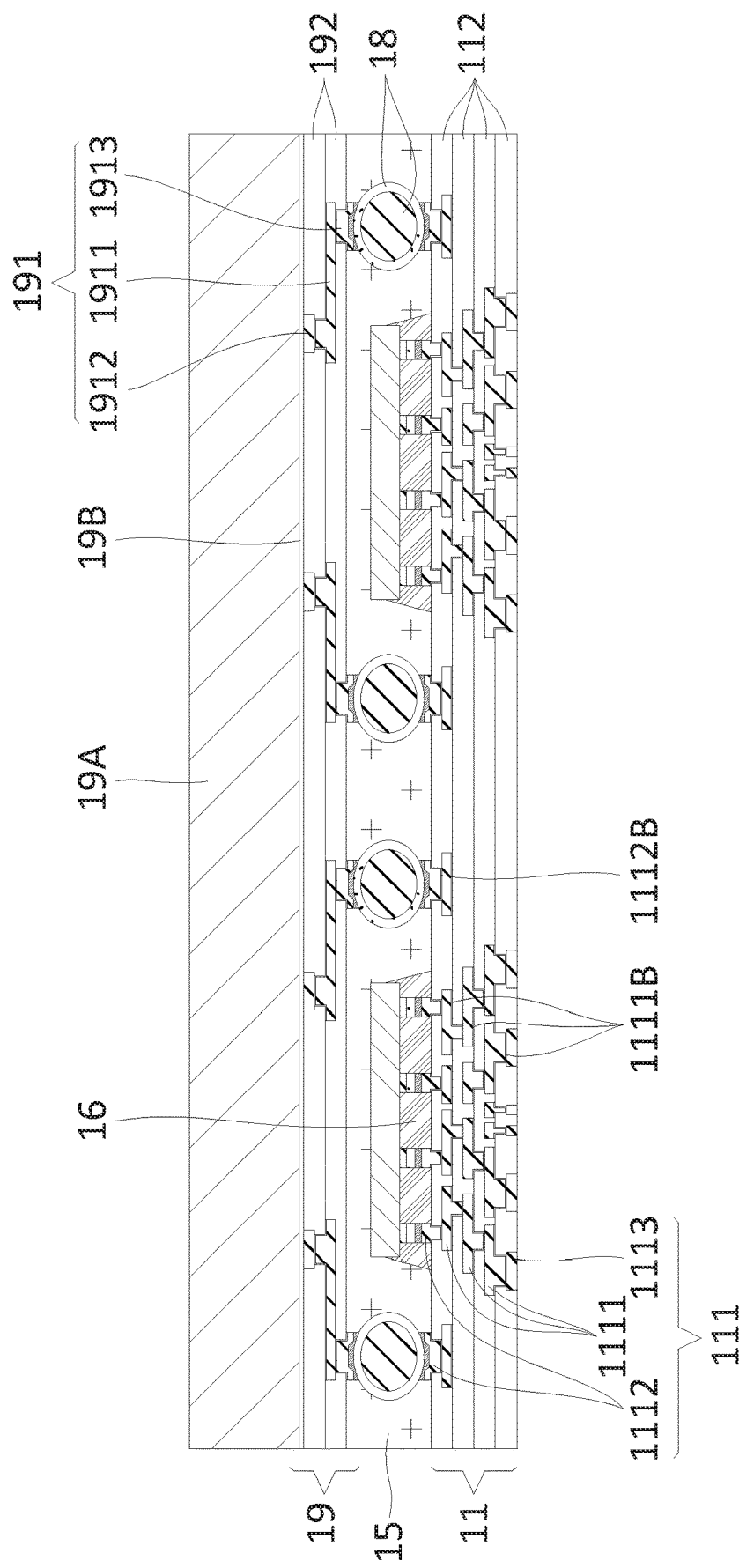

FIG. 2H shows a cross-sectional view of semiconductor device 10 at a later stage of manufacture. In the example shown in FIG. 2H, bottom carrier 11A can be removed from bottom substrate 11. In some examples, when temporary adhesive is located between bottom substrate 11 and bottom carrier 11A, adhesiveness of temporary adhesive can be removed by applying heat or light, for example a laser beam, to the temporary adhesive. In some examples, bottom carrier 11A can be removed from bottom substrate 11 using a mechanical force. In some examples, bottom carrier 11A can be removed using mechanical polishing or chemical etching process. In some examples, seed layer 11B can be removed from bottom interconnects 1113 and dielectric structure 112 located on bottom substrate 11. In some examples, seed layer 11B located on bottom sides of bottom interconnects 1113 can be removed using a chemical etching process. Accordingly, bottom sides of bottom interconnects 1113 can be exposed through dielectric structure 112.

Figure 2I:
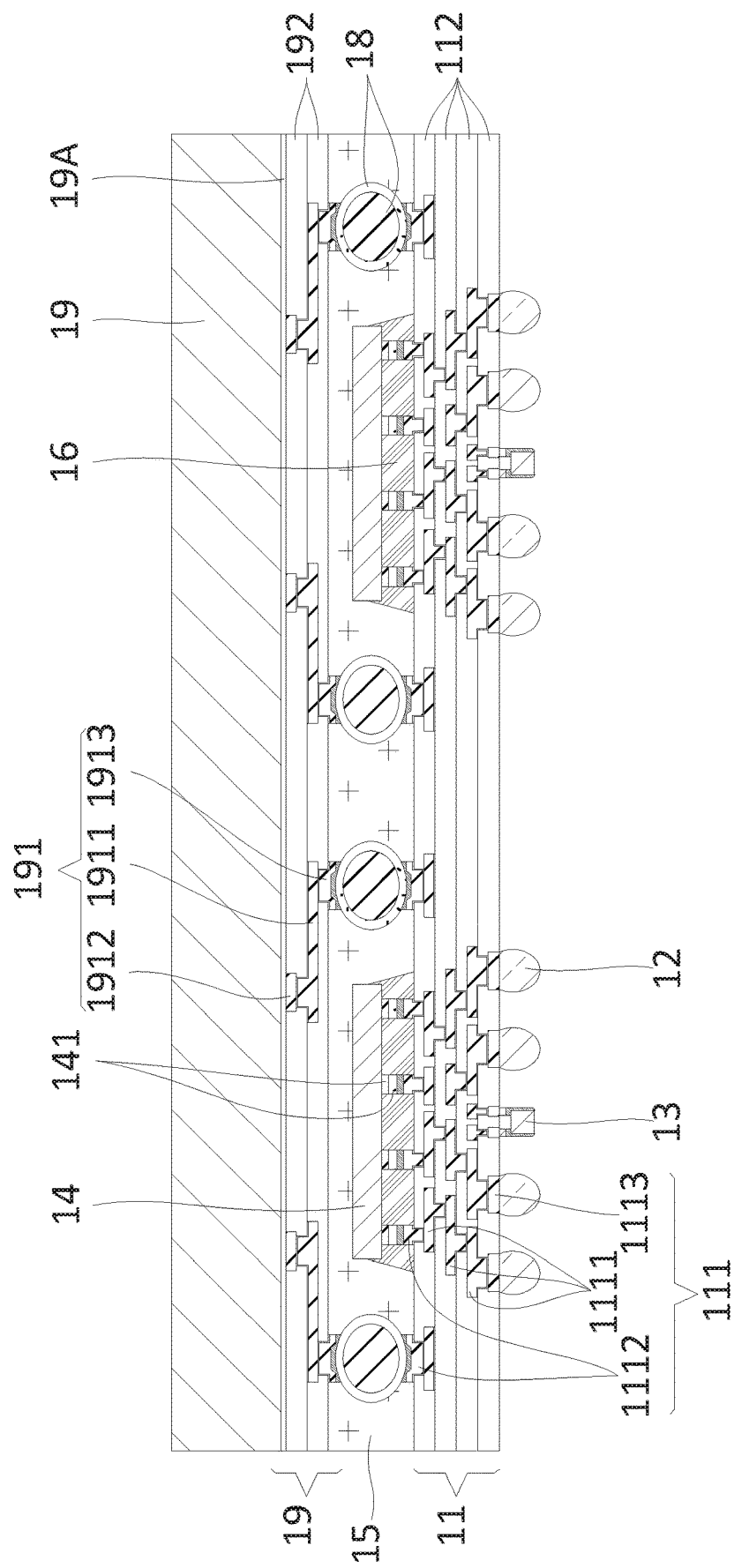

FIG. 2I shows a cross-sectional view of semiconductor device 10 at a later stage of manufacture. In some examples, prior to removing top carrier 19A, bottom carrier 11A can be removed, and external interconnects 12 can be provided on the bottom side of bottom substrate 11. In the example shown in FIG. 2I, external interconnects 12 can be positioned or provided on the bottom of bottom substrate 11. In some examples, external interconnects 12 can be coupled with the first conductive structure 111, for example external interconnects 12 can be connected to bottom interconnects 1113 located on bottom substrate 11. External interconnects 12 can comprise or can be referred to as pads, lands, bumps or solder balls. External interconnects 12 can be coupled with bottom interconnects 1113 using a mass reflow process or a laser assist bonding process after positioning external interconnects 12 on bottom interconnects 1113. External interconnects 12 can have a diameter in the range from approximately 25 μm to approximately 300 μm. External interconnects 12 can electrically connect semiconductor device 10 to an external device. In some examples, one or more electronic components 13 can be coupled the bottom of bottom substrate 11. The one or more electronic components 13 can be coupled with conductive structure 111.

Figure 2J:
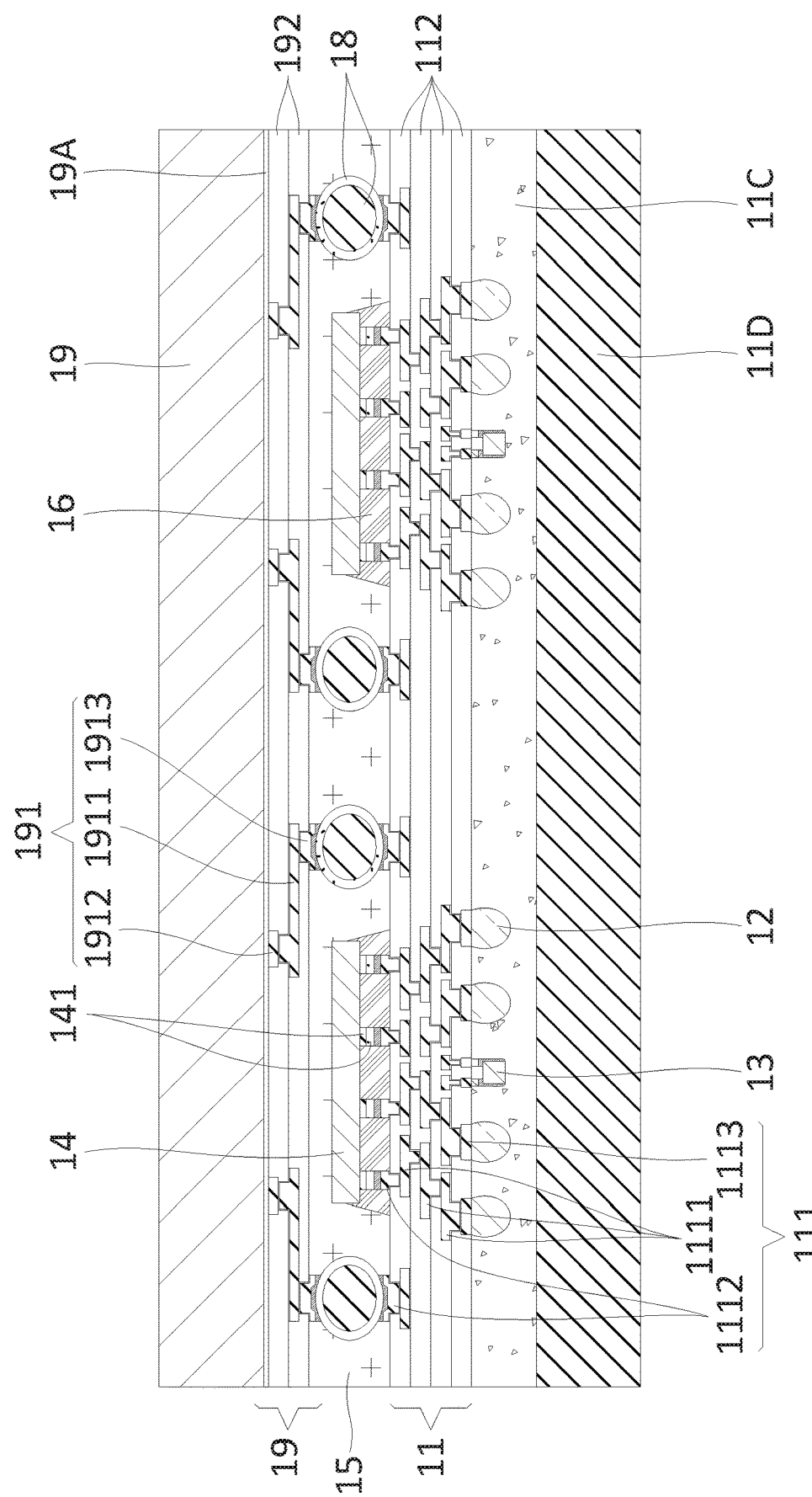

FIG. 2J show a cross-sectional views of semiconductor device 10 at a later stage of manufacture. In some examples, carrier 11D can be attached via temporary adhesive 110 adhered to bottom substrate 11 and external interconnects 12. Carrier 11D can be configured to maintain semiconductor device 10 at a planar state during subsequent removal of top carrier 19A.

Figure 2K:
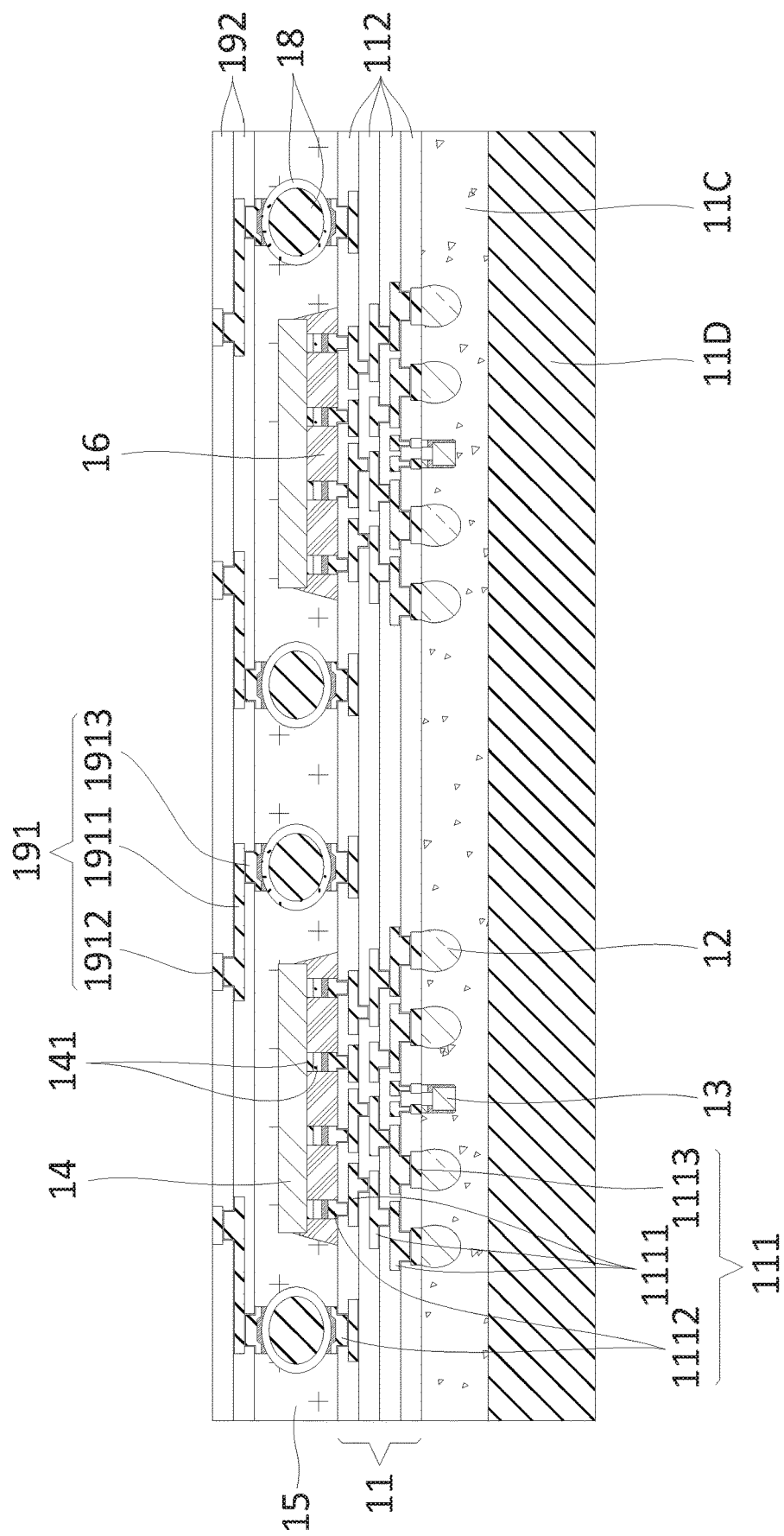

FIG. 2K shows a cross-sectional view of semiconductor device 10 at a later stage of manufacture. In the example shown in FIG. 2K, top carrier 19A can be removed from top substrate 19. Removing of top carrier 19A can be similar to removing of bottom carrier 11A. In some examples, when a temporary adhesive is located between top substrate 19 and top carrier 19A, adhesiveness of the temporary adhesive can be removed by applying heat or light, for example a laser beam, to the temporary adhesive, to easily remove top carrier 19A from top substrate 19. In some examples, seed layer 19B located on top interconnects 1912 of top substrate 19 can also be removed using an etching process. Therefore, top interconnects 1912 of top substrate 19 can be exposed through dielectric structure 192. In some examples, another electronic device, another semiconductor, another device, or another semiconductor package can be coupled to top interconnects 1912 of top substrate 19.

Figure 2L:
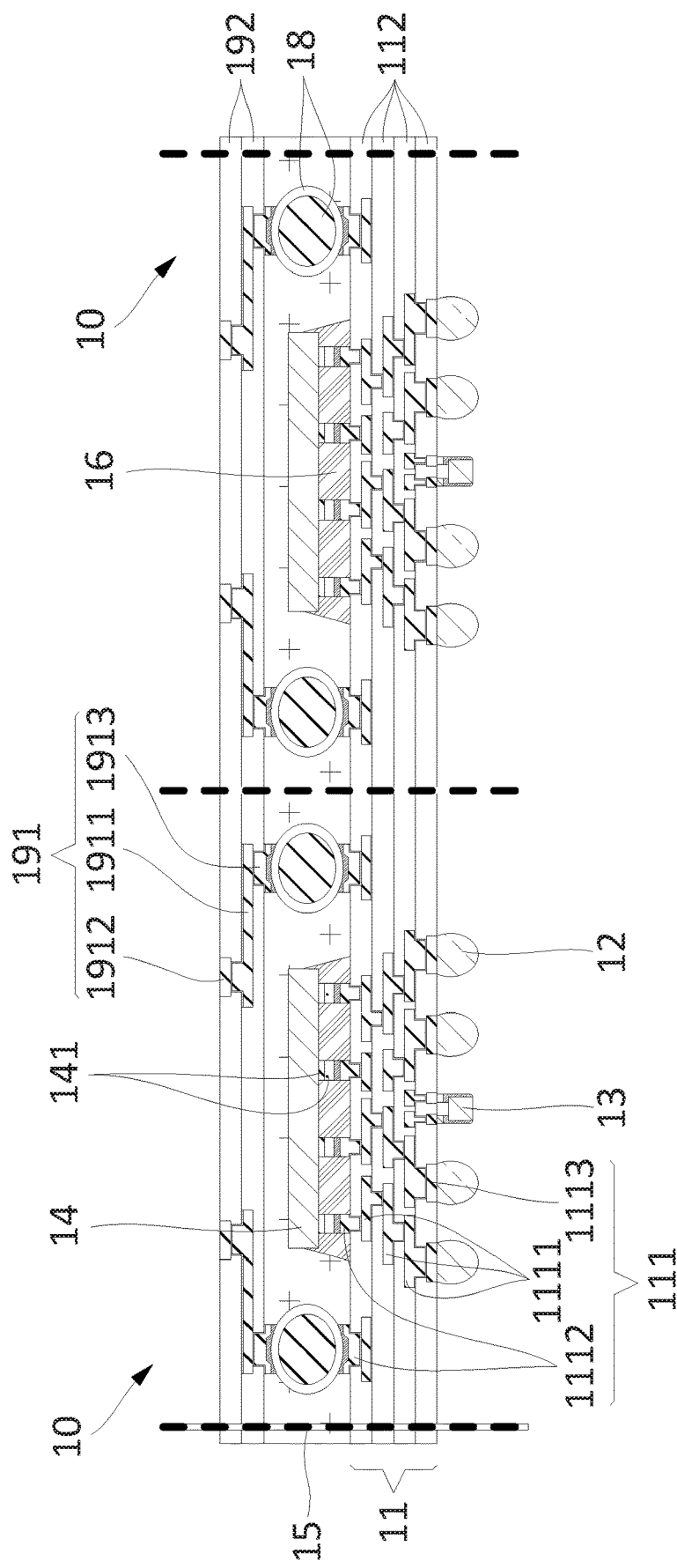

FIG. 2L shows a cross-sectional view of semiconductor device 10 at a later stage of manufacture. In the example shown in FIG. 2L, a singulation process can be performed. Semiconductor devices 10 manufactured in arrays of mass quantities can be separated into individual semiconductor devices 10 at this stage. Top carrier 19A, bottom carrier 11A, and any additional carriers such as carrier 11D can be removed, and semiconductor device 10 can be singulated through top substrate 19, bottom substrate 11, and body 15. In some examples, top substrate 19, body 15, and bottom substrate 11 can be subjected to sawing or singulation by means of a blade wheel or laser beam to provide each individual semiconductor device 10. Due to such processing characteristics, lateral sides of top substrate 19, body 15, and bottom substrate 11 can be coplanar. In the example of FIG. 2L, sawing or singulation lines are indicated by three thick vertical lines.

FIGS. 3A to 3G show cross-sectional views of an example method for manufacturing an example semiconductor device. In some examples, the method for manufacturing semiconductor device 10 shown in FIGS. 3A to 3G can be similar to the method shown in FIGS. 2A to 2L. As shown in FIGS. 3A-3G, substrates 19 can be coupled to bottom substrate 11 individually rather than simultaneously in array format. In some examples the opposite can occur, where bottom substrates 11 can be coupled to top substrate 19 individually.

Figure 3A:
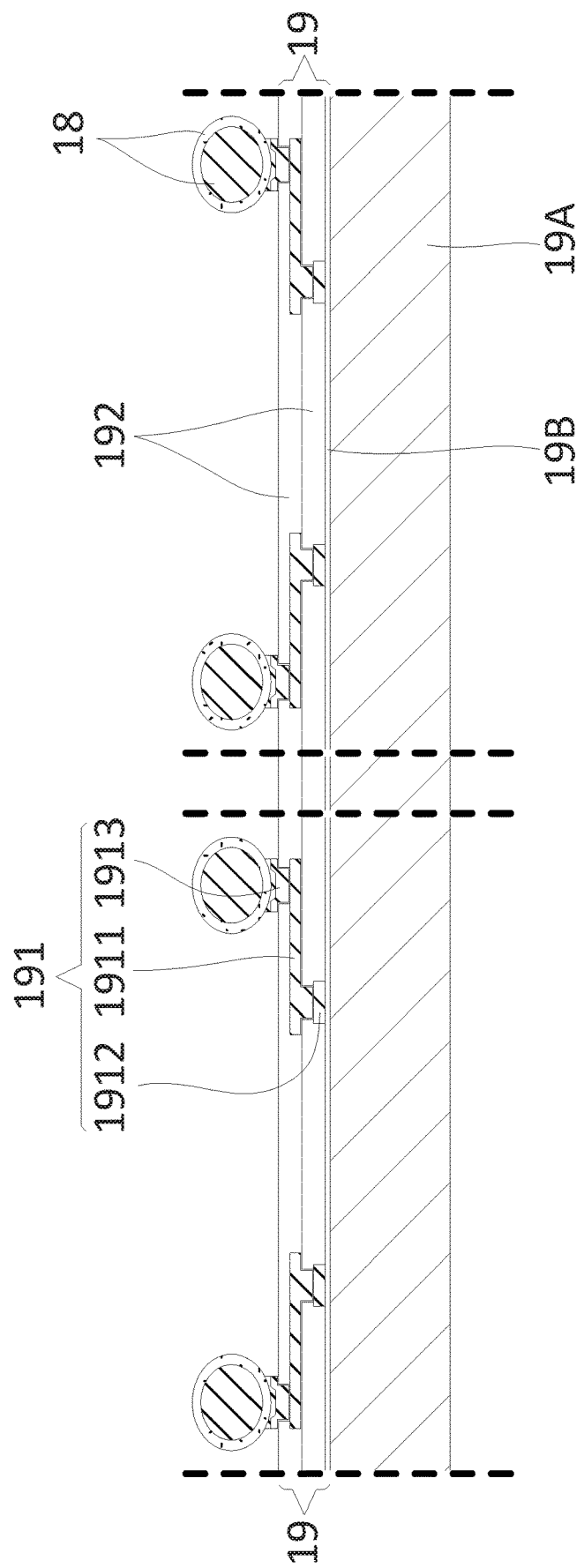
FIGS. 3A to 3I show cross-sectional views of an example method for manufacturing an example semiconductor device.

FIG. 3A shows a cross-sectional view of semiconductor device 10 at an early stage of manufacture. In the example shown in FIG. 3A, individual top substrate 19 units can be provided by singulating through top substrate 19 and top carrier 19A to define a first top substrate 19 unit. In some examples, each individual top substrate 19 unit can be singulated from top substrate 19 array. After singulation, lateral sides of top substrate 19 and top carrier 19A can be coplanar. In FIG. 3A, sawing or singulation lines are indicated by four thick lines.

Figure 3B:
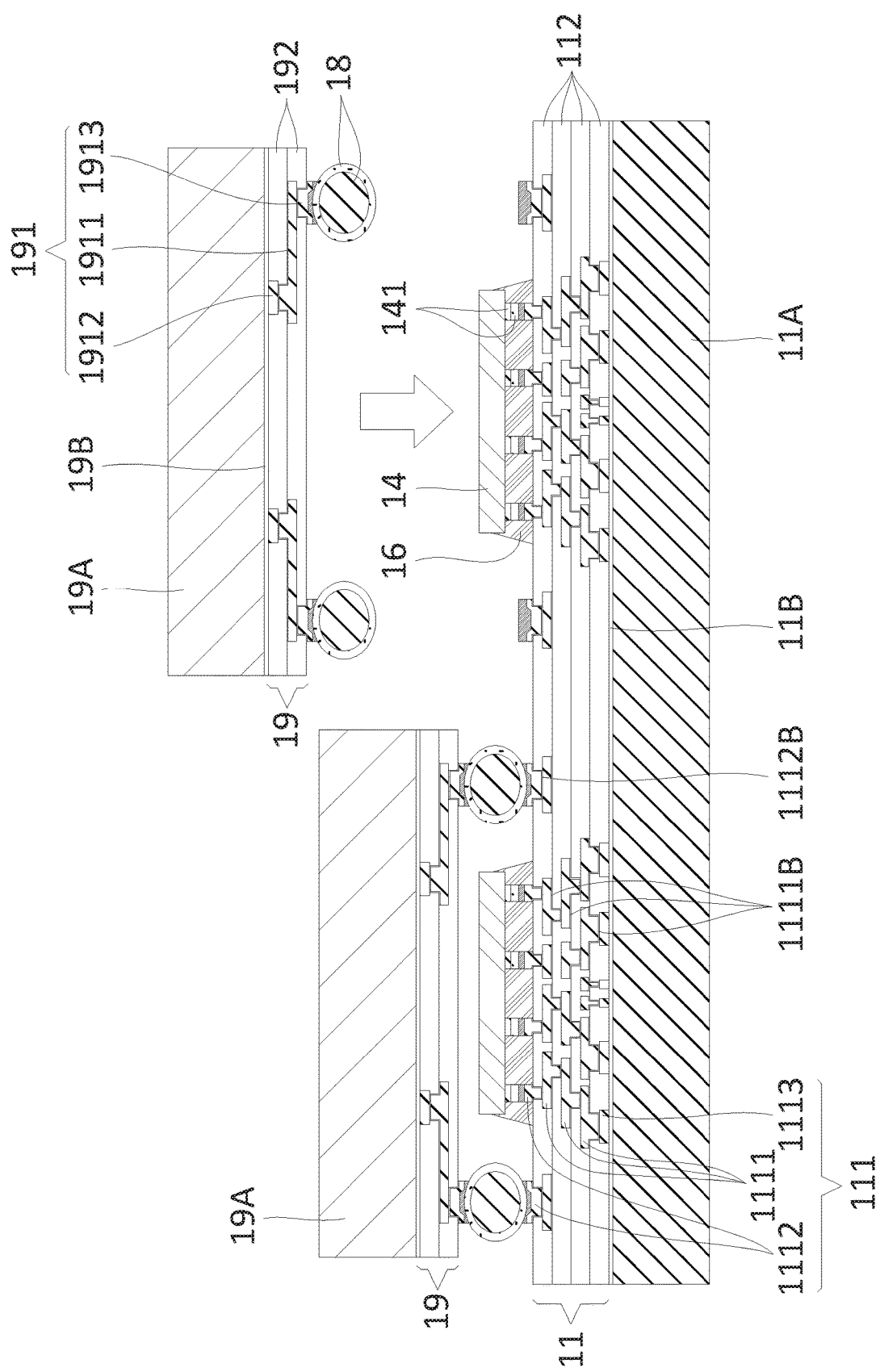

FIG. 3B shows a cross-sectional view of semiconductor device 10 at a later stage of manufacture. In the example shown in FIG. 3B, individual top substrates 19 units can be provided over electronic component 14 and over bottom substrate 11 and can be coupled with bottom substrate 11. In some examples, bottom interconnects 1913 of top substrate 19 can be coupled to top interconnects 1112 of bottom substrate 11 through internal interconnects 18. In some examples, individual top substrate 19 units can be sequentially positioned on bottom substrate 11. In some examples, individual top substrate 19 units can be simultaneously positioned on bottom substrate 11.

Figure 3C:
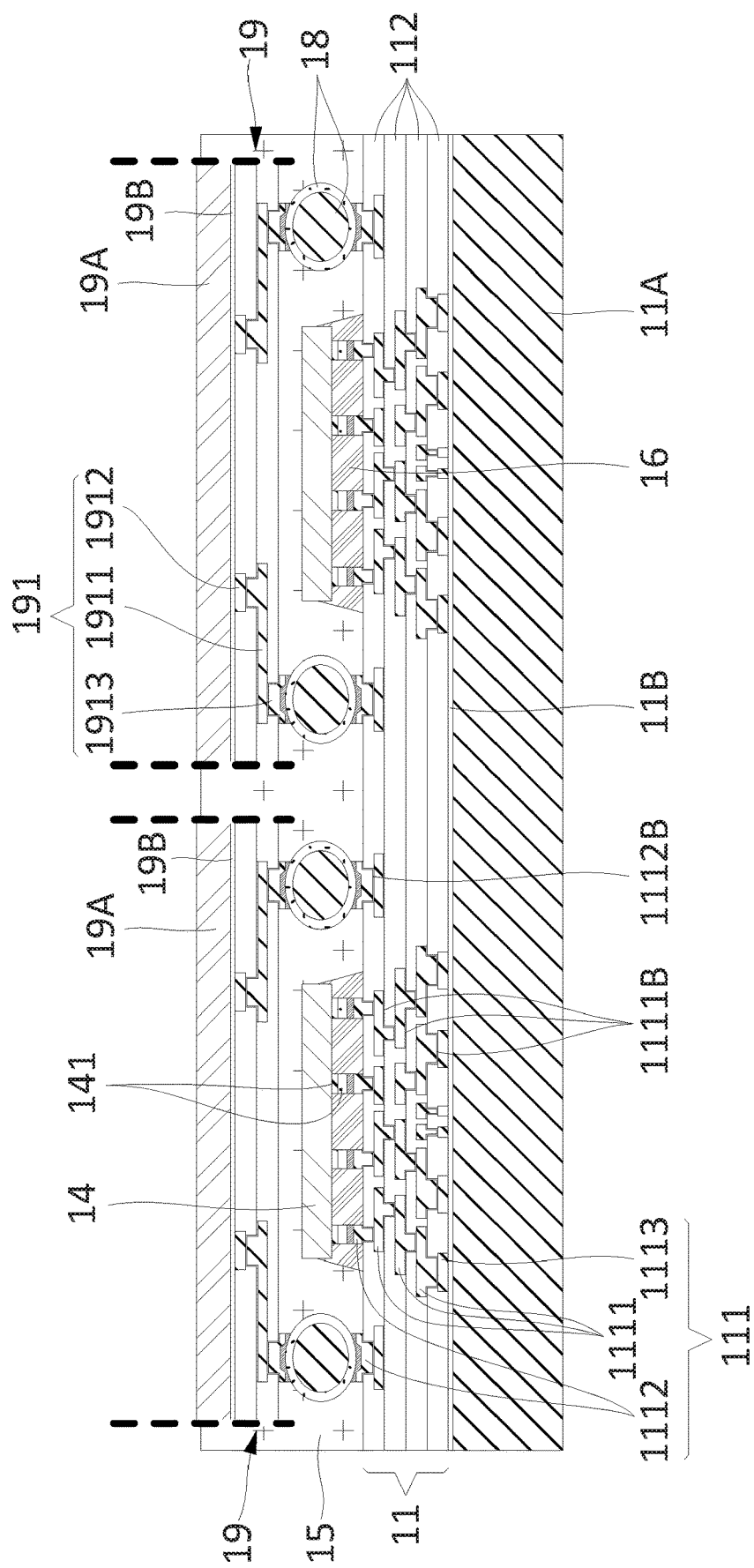

FIG. 3C shows a cross-sectional view of semiconductor device 10 at a later stage of manufacture. In the example shown in FIG. 3C, body 15 can be provided between top substrate 19 unit and bottom substrate 11. In some examples, since spaces or gaps are created between individual top substrates 19, body 15 can be provided using a compression molding process in which resin is injected into the spaces or gaps. In some examples, body 15 can be provided using a film assist molding process. In some examples, resin can be injected into spaces between top substrates 19 and bottom substrate 11 in a state in which an elastic film is positioned on multiple top substrates 19 and then compressed using a mold. In some examples, film assist molding or transfer molding can be employed to provide body 15. Body 15 can be located on spaces or gaps between top carriers 19A, between substrates 19, and between top substrates 19 and bottom substrate 11. In some examples, body 15 can cover a periphery of the first top substrate 19 unit.

In some examples, top carrier 19A and body 15 can be subjected to grinding. As the result of grinding, top carrier 19A can have a remaining thickness of approximately 50 µm. In some examples, after grinding, top carrier 19A or body 15 can be chemically etched.

In some examples, a partial sawing process can be performed. In some examples, the partial sawing process can be performed along peripheries of top carrier 19A and top substrate 19. In some examples, the partial sawing process can also be performed on a region of body 15 corresponding to the periphery of top substrate 19 unit. In some examples, the partial sawing process can be performed by a blade wheel or laser beam. Peripheries of top carrier 19A and top substrate 19 can be separated from body 15 by the partial sawing process. In some examples, spaces or gaps can be provided between each of top carrier 19A, top substrate 19, and body 15. In FIG. 3C, partial sawing lines are indicated in forms of straight lines.

Figure 3D:
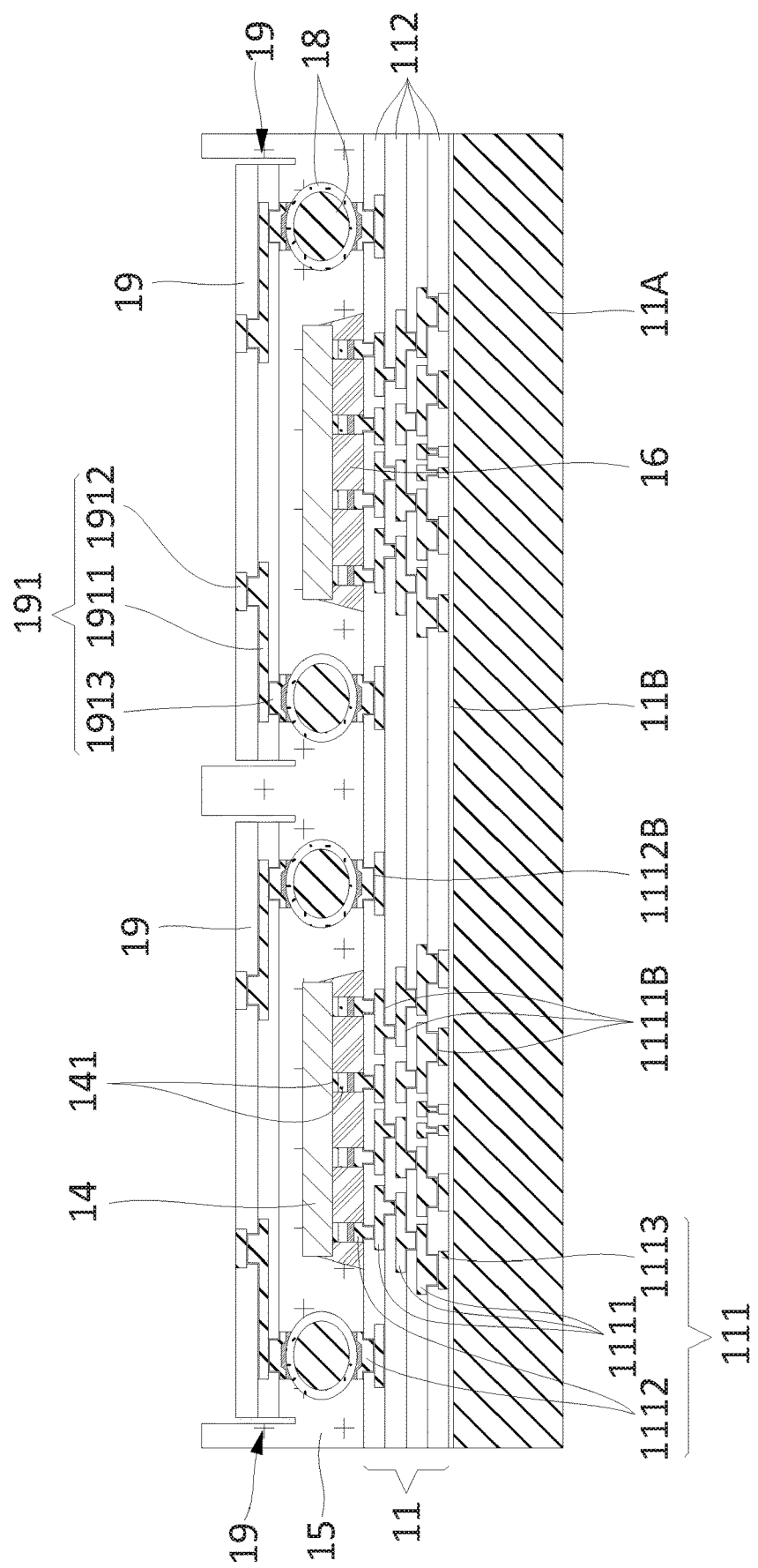

FIG. 3D shows a cross-sectional view of semiconductor device 10 at a later stage of manufacture. In the example shown in FIG. 3D, top carrier 19A or seed 19B can be removed from top substrate 19. In some examples, top carrier 19A can be removed prior to removal of bottom carrier 11A. Such a removing process can be similar to the process previously described in FIG. 2 for removing top carrier 19A from top substrate 19. Top interconnects 1912 of top substrate 19 can be exposed through dielectric structure 192. In some examples, when top carrier 19A is removed, a region of body 15 between top substrates 19 can protrude. Spaces or gaps can exist between the lateral sides of top substrate 19 and body 15.

Figure 3E:
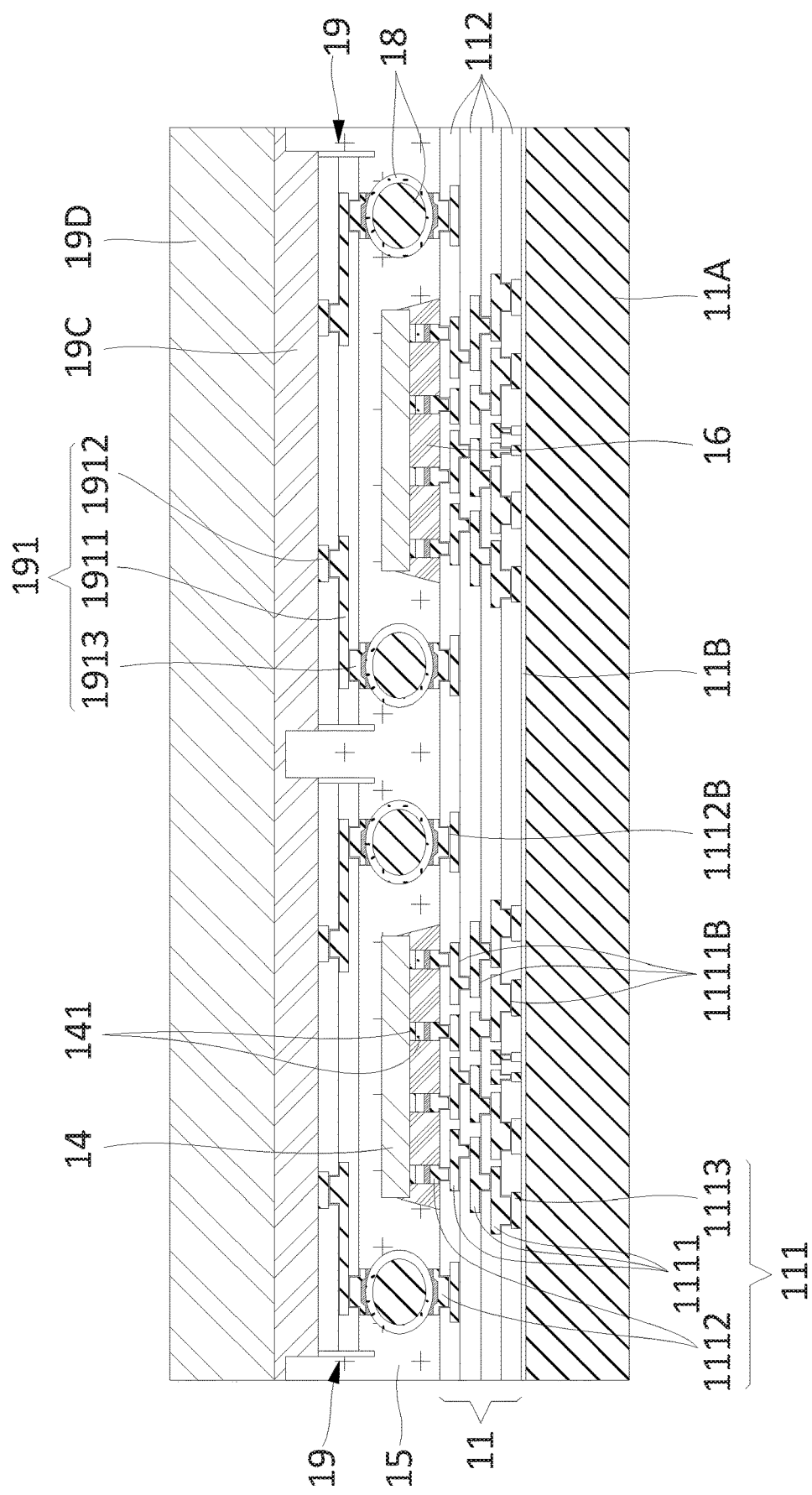

FIG. 3E shows a cross-sectional view of semiconductor device 10 at a later stage of manufacture. In the example shown in FIG. 3D, temporary adhesive 19C can cover top substrates 19 and the protruding region of body 15, and another planar top carrier 19D can be adhered on temporary adhesive 19C. Multiple top substrates 19 can be coupled to one single top carrier 19D through temporary adhesive 19C. In some examples, the additional top carrier 19D can be provided over the first top substrate 19 unit prior to removing bottom carrier 11A.

Figure 3F:
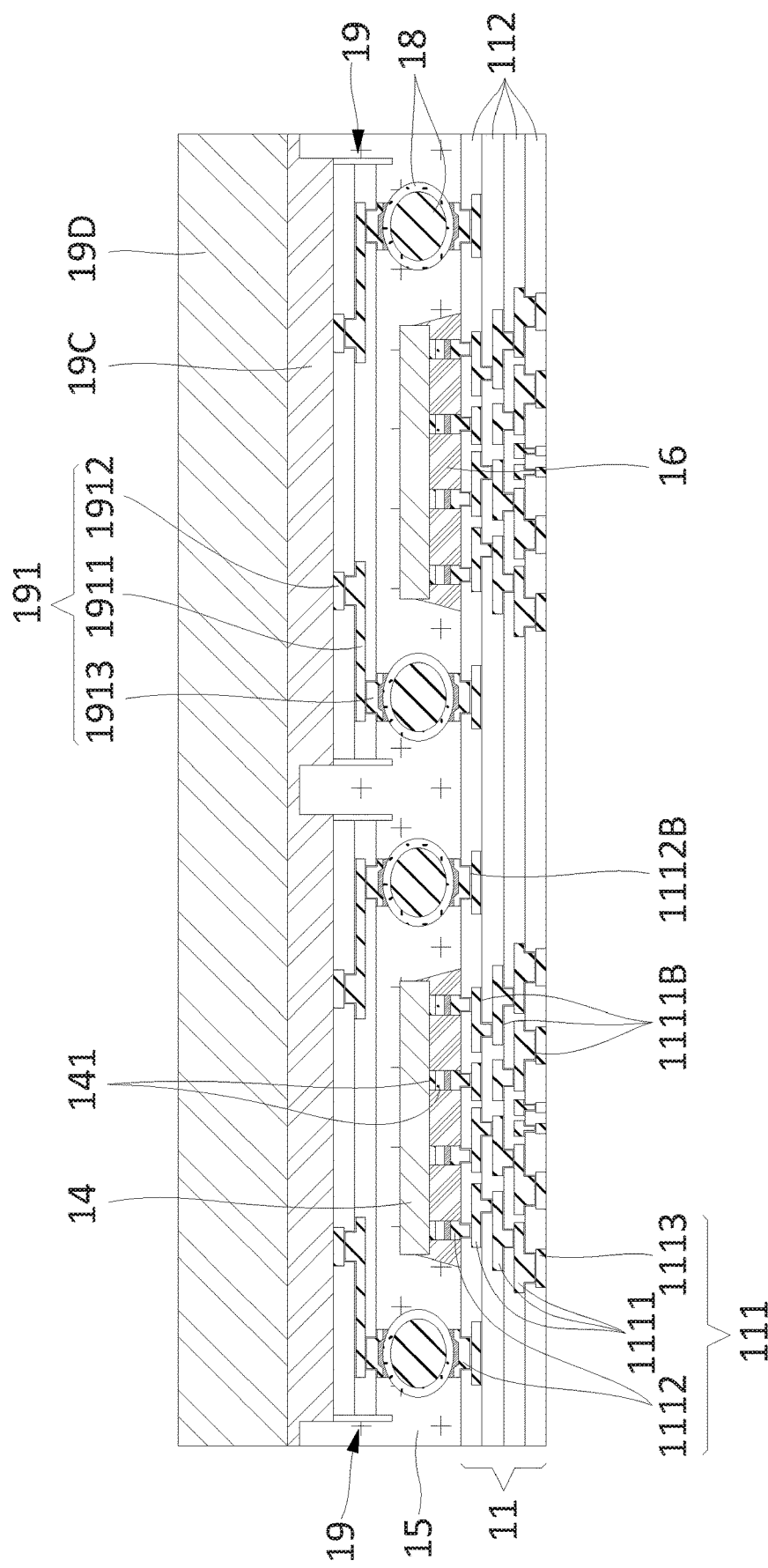

FIG. 3F shows a cross-sectional view of semiconductor device 10 at a later stage of manufacture. In the example shown in FIG. 3F, bottom carrier 11A can be removed from bottom substrate 11. In some examples, bottom carrier 11A can be removed prior to removing top carrier 19A. Seed layer 11B located at bottom of substrate 11 can be removed. Bottom sides of bottom interconnects 1113 can be exposed through dielectric structure 112.

Figure 3G:
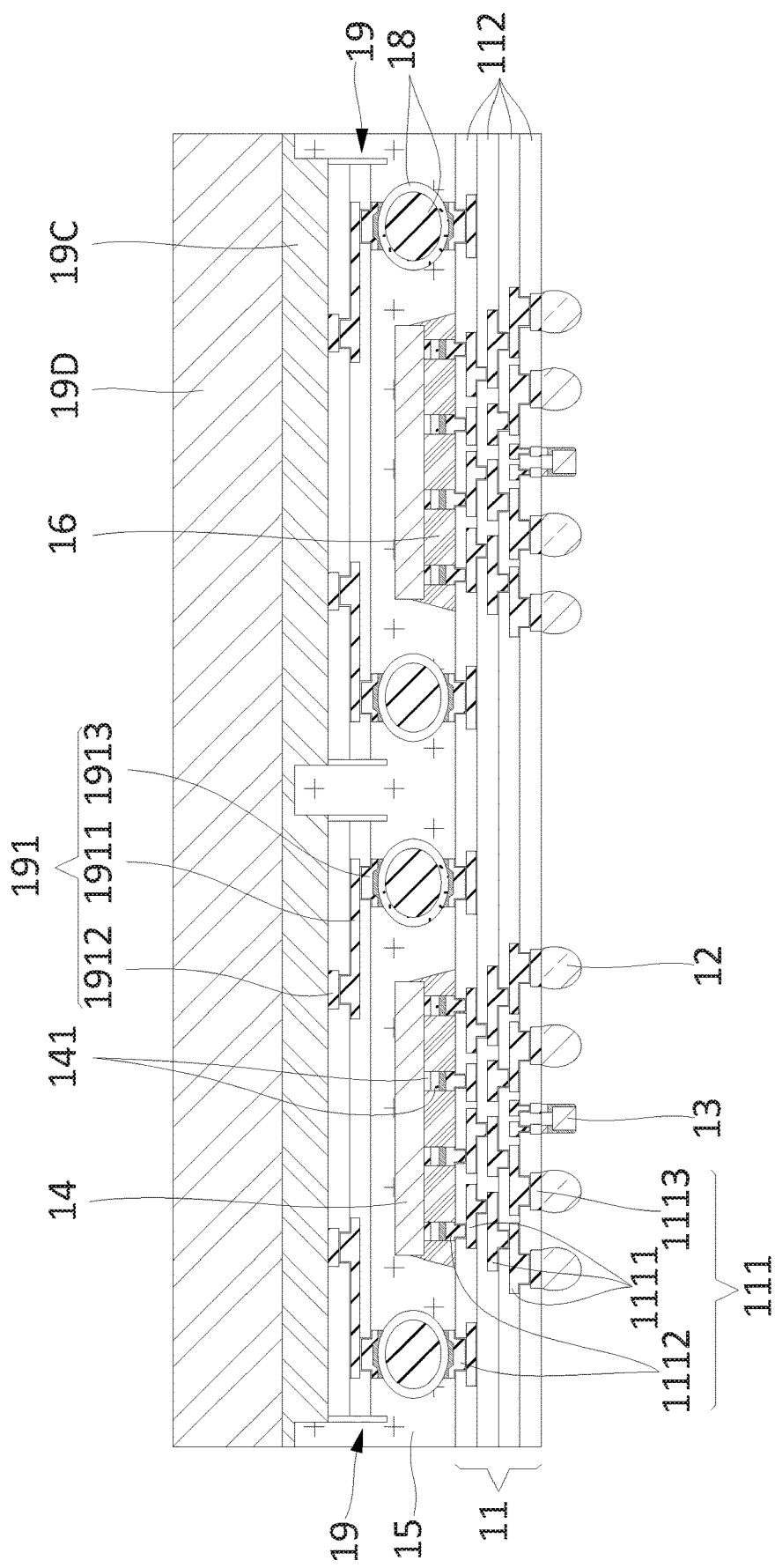

FIG. 3G shows a cross-sectional view of semiconductor device 10 at a later stage of manufacture. In the example shown in FIG. 3F, external interconnects 12 can be coupled to bottom interconnects 1113 of bottom substrate 11. In some examples, one or more electronic components 13 can also be coupled to bottom of bottom substrate 11. In some examples, external interconnects 12 or electronic components 13 can be provided on the bottom side of bottom substrate 11 after removing bottom carrier 11A and can be coupled with first conductive structure 111.

Figure 3H:
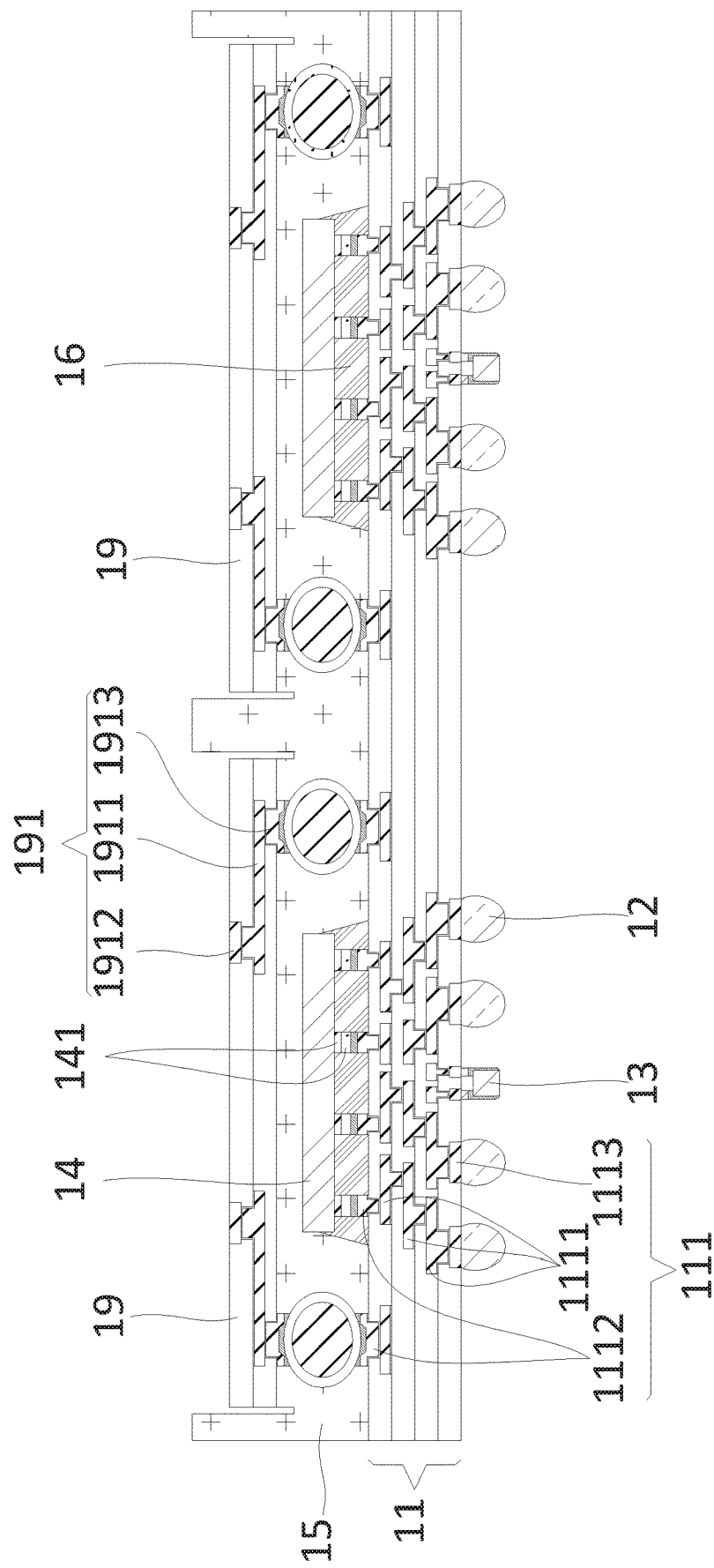
Figure 3L:
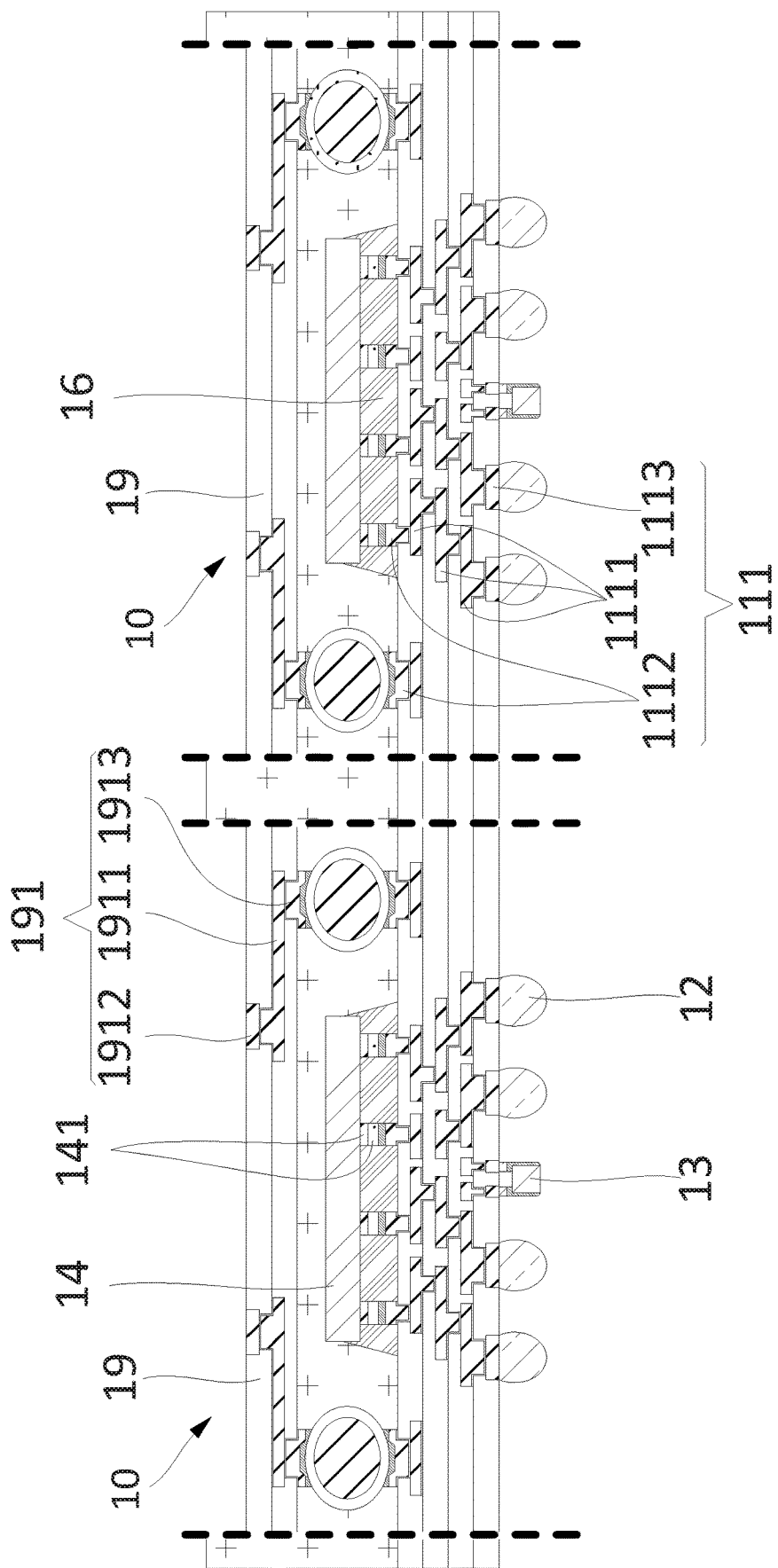

FIG. 3H shows a cross-sectional view of semiconductor device 10 at a later stage of manufacture. In the example shown in FIG. 3H, top carrier 19D can be removed from top substrate 19. In some examples, adhesiveness of the temporary adhesive 19C can be removed by applying heat or light, for example a laser beam, to the temporary adhesive 19C to easily remove top carrier 19D from top substrate 19. Accordingly, top interconnects 1912 of top substrate 19 can be exposed through dielectric structure 192. In addition, since the partial sawing process has been previously performed, as described above, spaces or gaps can exist between side sides of top substrates 19 and the protruding region of body 15.

FIG. 3I shows a cross-sectional view of semiconductor device 10 at a later stage of manufacture. In the example shown in FIG. 3I, a singulation process can be performed. In some examples, additional top carrier 19D can be removed prior to performing singulation. In some examples, bottom substrate 11, body 15, and top substrate 19 can be subjected to singulation by a blade wheel or laser beam, yielding individual semiconductor device 10. In some examples, singulation lines can overlap with the previously described partial sawing lines. In some examples, lateral sides of bottom substrate 11, body 15, and top substrate 19 can be coplanar. In FIG. 3I, sawing lines are indicated in four thick lines. In some examples, the first top substrate 19 unit, bottom substrate 11, and body 15 can be singulated.

Figure 4:
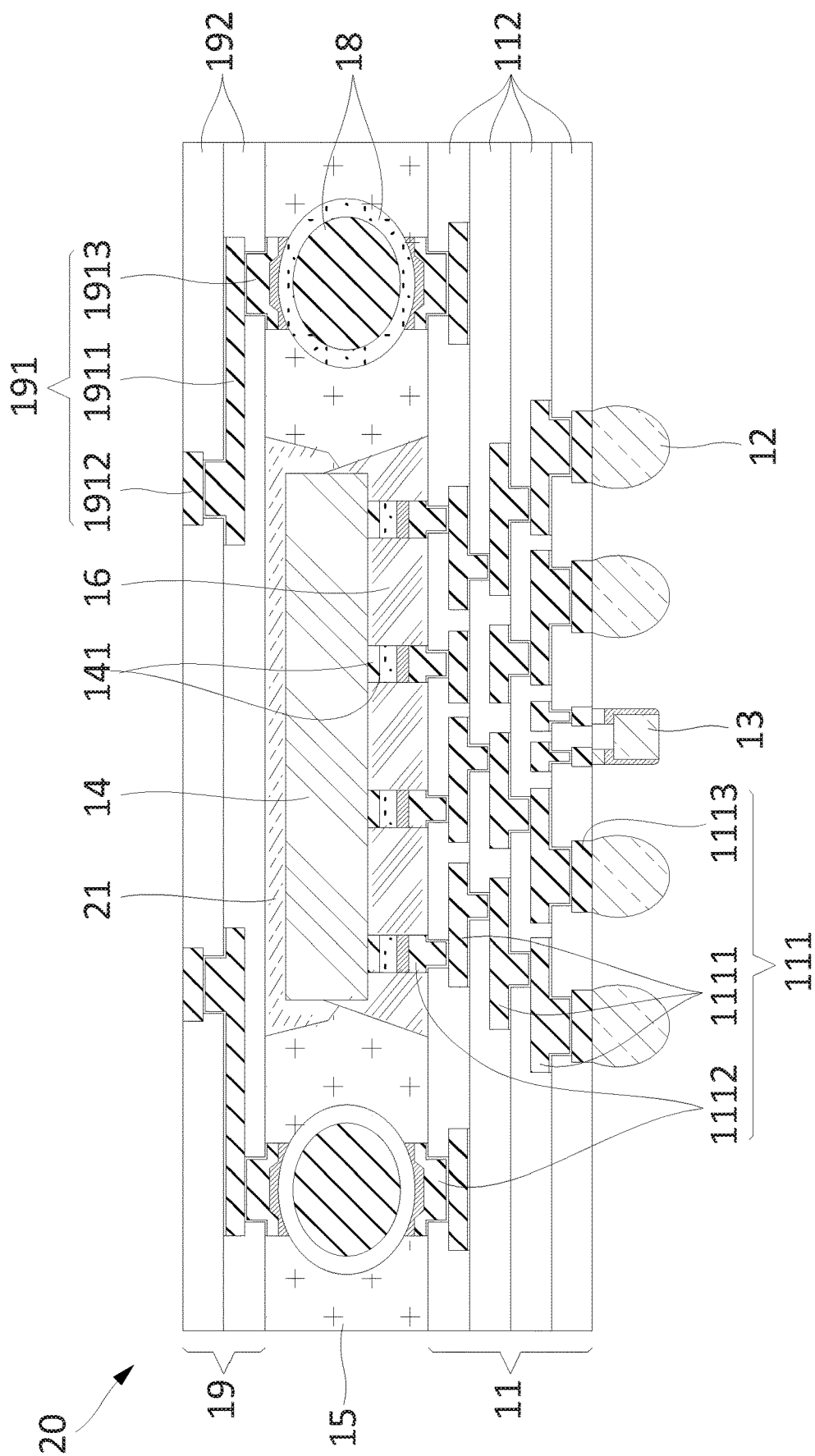
FIG. 4 shows a cross-sectional view of an example semiconductor device.

FIG. 4 shows a cross-sectional view of an example semiconductor device 20. In some examples, semiconductor device 20 can be similar to semiconductor device 10 shown in FIG. 1 and can comprise adhesive 21. In some examples, adhesive 21 can be between electronic component 14 and the bottom side of top substrate 19. In some examples, adhesive 21 can cover a top side and a lateral side of electronic component 14. In some examples, adhesive 21 can comprise a filler-free epoxy. In some examples, adhesive 21 can be positioned between electronic component 14 and top substrate 19. In some examples, top substrate 19 can be adhered to electronic component 14 through adhesive 21 before body 15 is provided between top substrate 19 and bottom substrate 11. Such a configuration with adhesive 21 can facilitate embodiments where the gap between top substrate 19 and electronic component 14 would otherwise be too narrow for body 15, or any filler material of body 15, to flow through or suitably fill when applied. In some examples, adhesive 21 can also extend to contact lateral sides of electronic component 14 or can contact a portion of underfill 16. In some examples, adhesive 21 can be provided between a top side of electronic component 14 and the bottom side of top substrate 19 prior to providing body 14 between top substrate 19 and bottom substrate 11.

In some examples, adhesive 21 can be provided in a process of connecting top substrate 19 and bottom substrate 11 to each other through internal interconnects 18. In some examples, adhesive 21 can be applied first to top substrate 19 and then can be adhered to electronic component 14. In some examples, adhesive 21 can be applied to electronic component 14 and then can be adhered to top substrate 19. In some examples, body 15 can be provided to contact the lateral or bottom periphery of adhesive 21. Adhesive 21 can have a thickness in the range from approximately 1 μm to approximately 50 μm. Mechanical adhesion between electronic component 14 and top substrate 19 can be enhanced by means of adhesive 21. In some examples, the gap between electronic component 14 and top substrate 19 can be minimized or narrowed when filled by adhesive 21 rather than by body 15.

Figure 5:
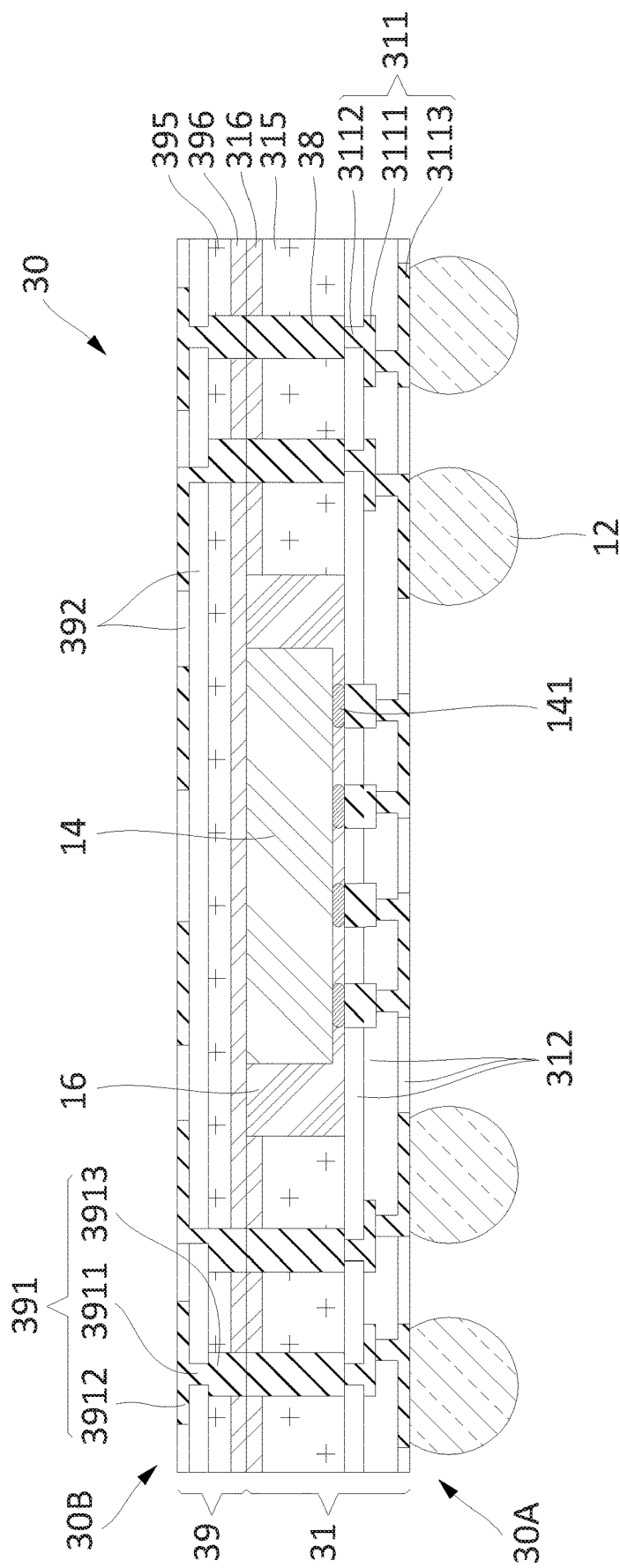
FIG. 5 shows a cross-sectional view of an example semiconductor device.

FIG. 5 shows a cross-sectional view of an example semiconductor device 30. In the example shown in FIG. 5, upper device portion 30B and lower device portion 30A are shown coupled together to define semiconductor device 30. Semiconductor device 30 can comprise cavity substrate 31, external interconnects 12, electronic component 14, underfill 16, internal interconnects 38, and substrate 39.

Cavity substrate 31 can comprise conductive structure 311 having conductive paths 3111, top interconnects 3112, and bottom interconnects 3113. Cavity substrate 31 can also comprise dielectric structure 312 having one or more dielectric layers, body 315, or interface dielectric 316. In some examples, cavity substrate 31 can comprise body 315 and inner sidewalls of body 315 defining a cavity and bounding electronic component 14. In some examples, a gap is defined between one of the inner sidewalls of body 315 and a sidewall of electronic component 14. In some examples, internal interconnect 38 can comprise a pillar.

Substrate 39 can comprise conductive structure 391 having conductive paths 3911, top interconnects 3912, and bottom interconnects 3913. Substrate 39 can also comprise dielectric structure 392 having one or more dielectric layers and interface dielectric 396.

In some examples, cavity substrate 31 or cavity substrate 39 can be similar to other substrates described in this disclosure, such as substrate 11 or 19. In some examples, cavity substrate 31, conductive structure 311, conductive paths 3111, top interconnects 3112, bottom interconnects 3113, or dielectric structure 312, can be respectively similar to substrate 11, conductive structure 111, conductive paths 1111, top interconnects 1112, bottom interconnects 1113, or dielectric structure 112 described in this disclosure. In some examples, substrate 39, conductive structure 391, conductive paths 3911, top interconnects 3912, bottom interconnects 3913, or dielectric structure 392 can be respectively similar to substrate 19, conductive structure 191, conductive paths 1911, top interconnects 1912, bottom interconnects 1913, or dielectric structure 192 described in this disclosure. In some examples, cavity substrate 31 or substrate 39 can comprise an RDL substrate.

Cavity substrate 31, external interconnects 12, underfill 16, internal interconnects 38, and substrate 39 can be referred to as semiconductor package.

Figure 6A:
FIGS. 6A to 6Q show cross-sectional views of an example method for manufacturing an example semiconductor device.
Figure 6B:
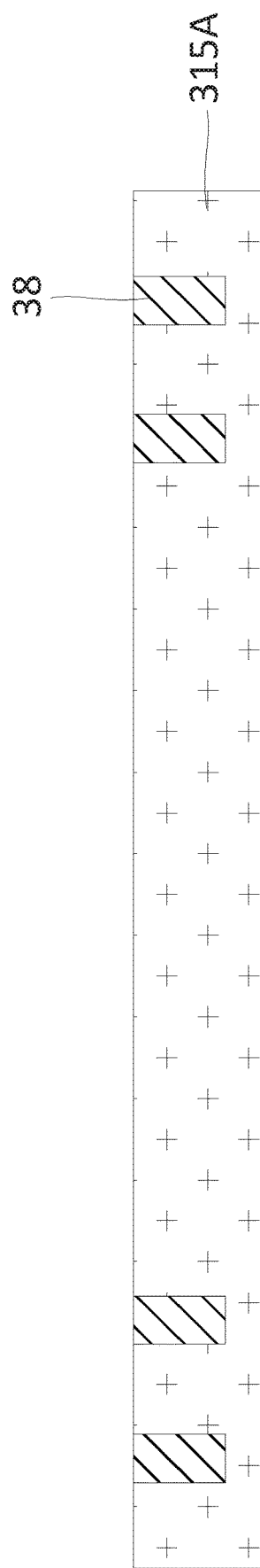
Figure 6C:
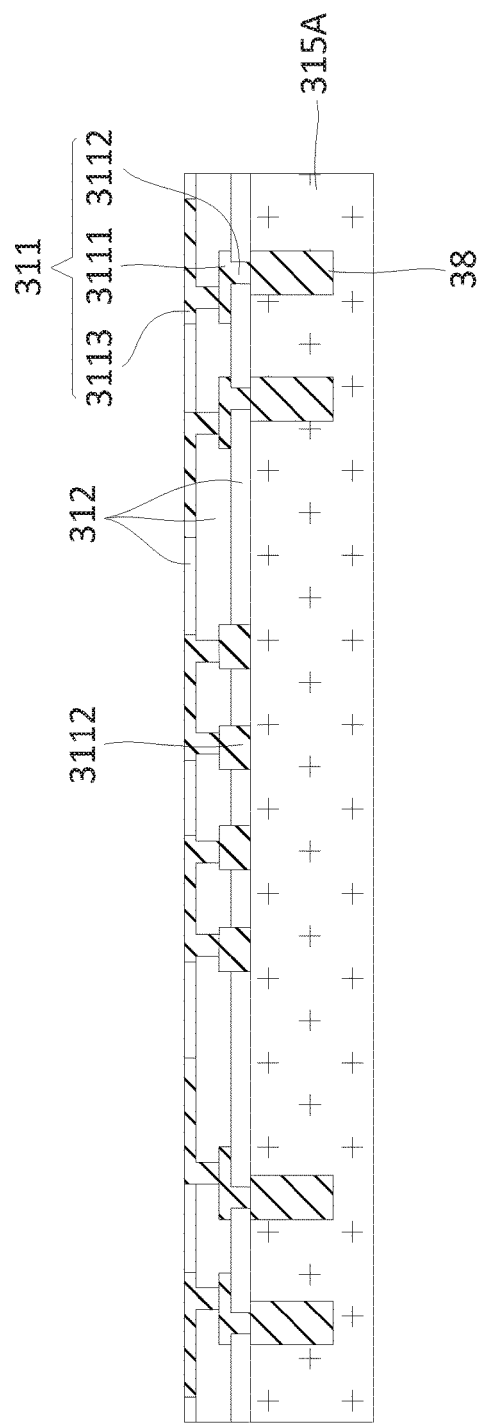
Figure 6D:
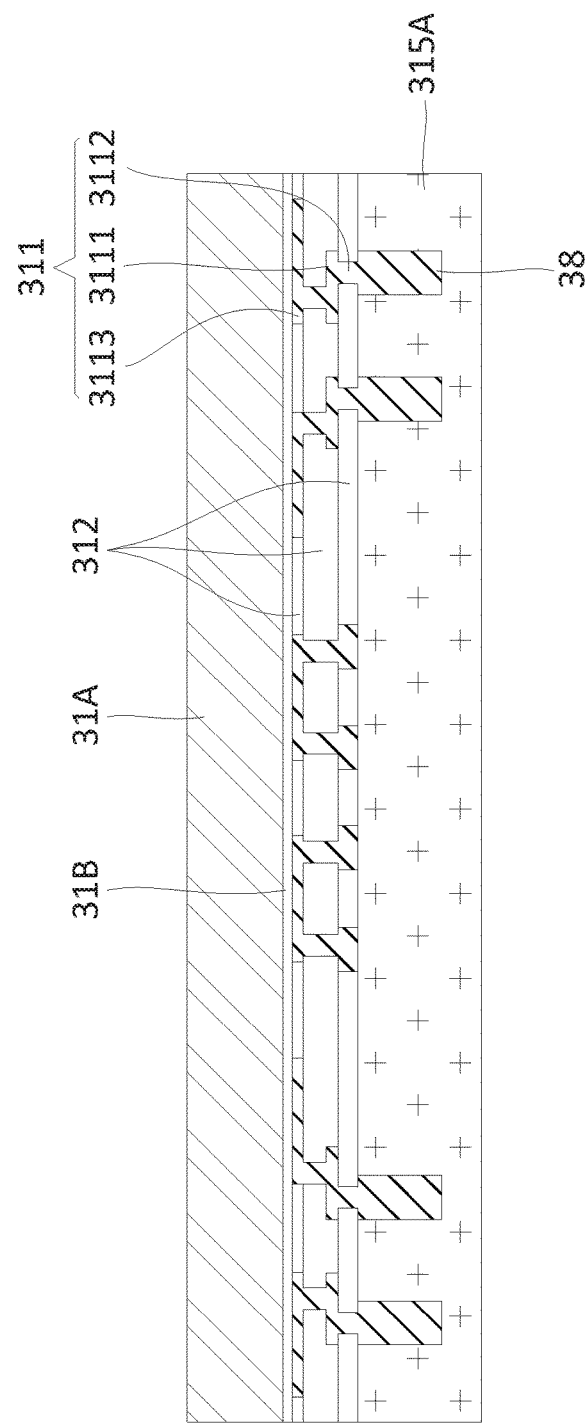
Figure 6E:
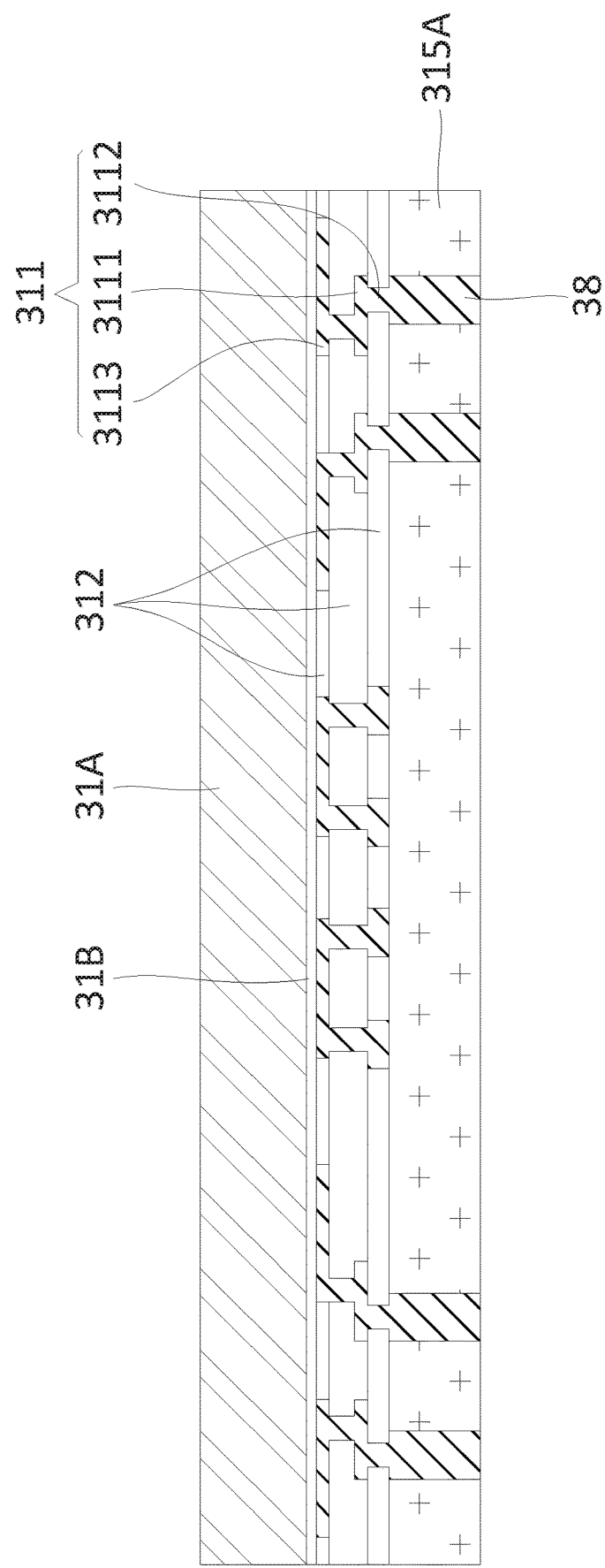
Figure 6F:
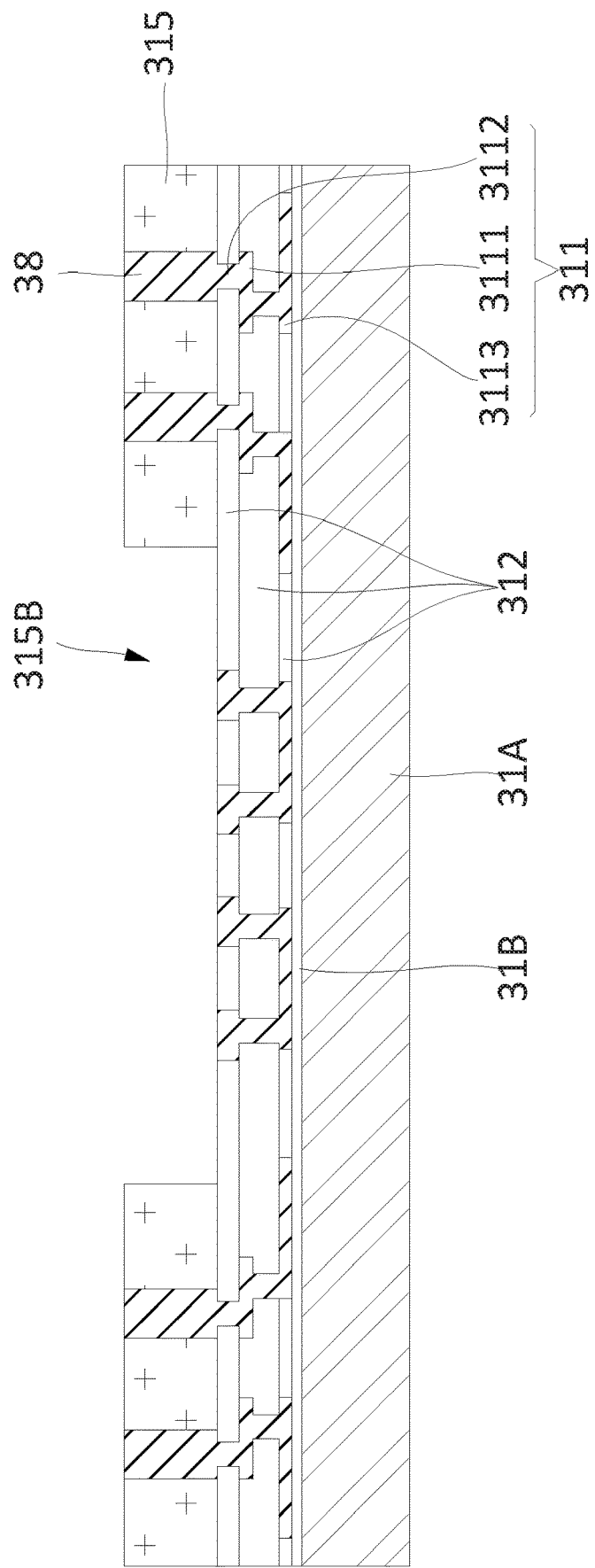
Figure 6G:
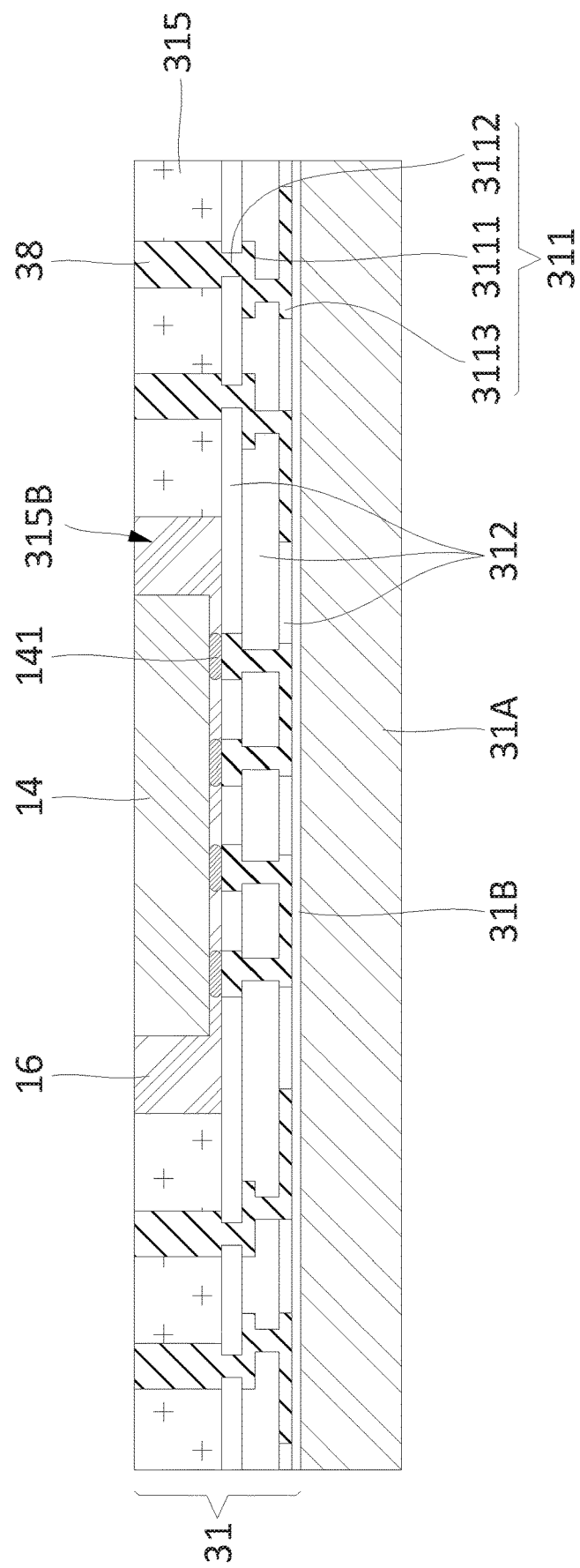
Figure 6J:
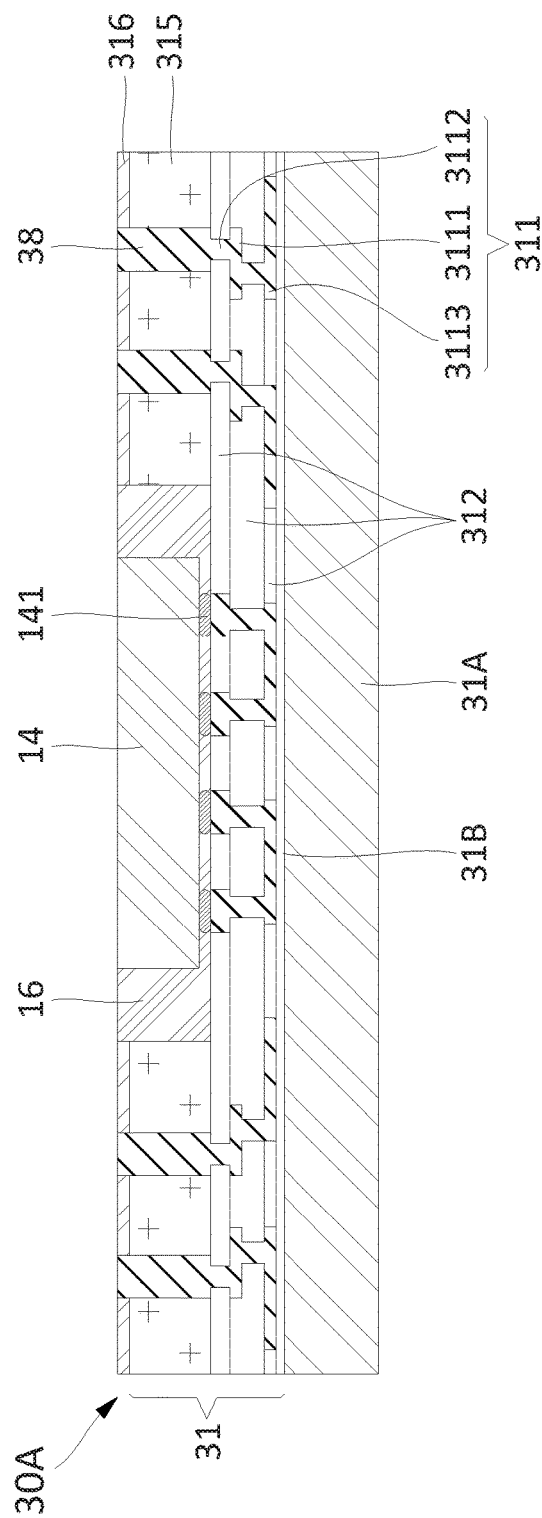
Figure 6K:
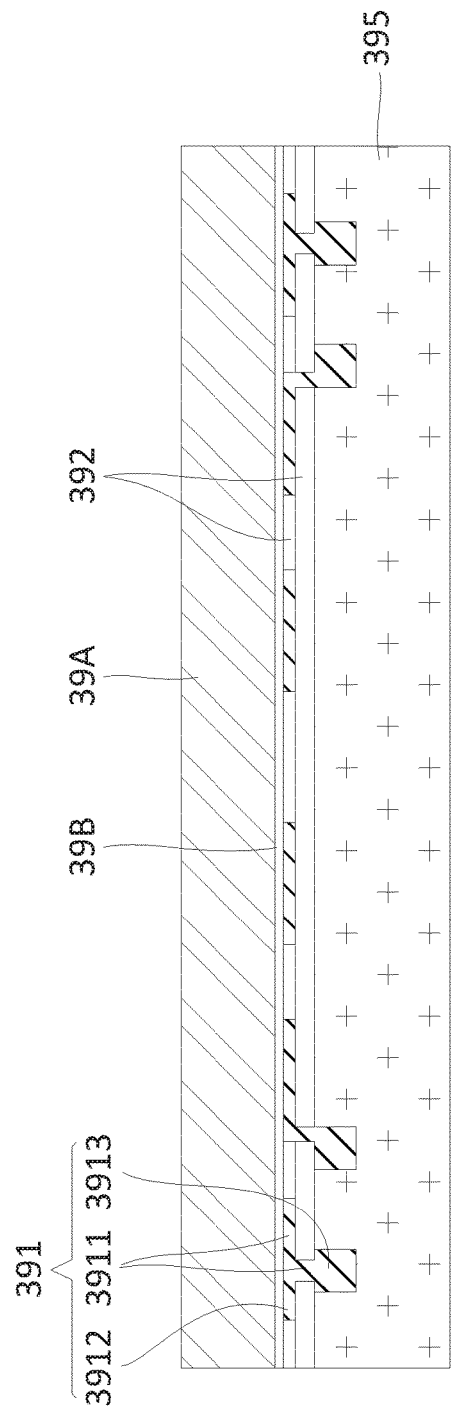
Figure 6N:
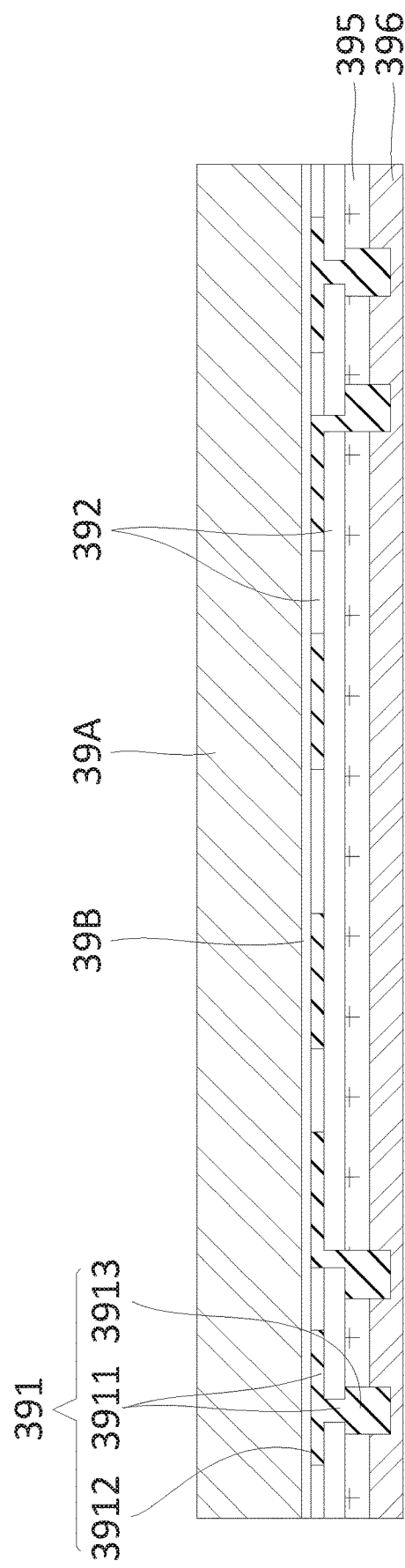
Figure 6O:
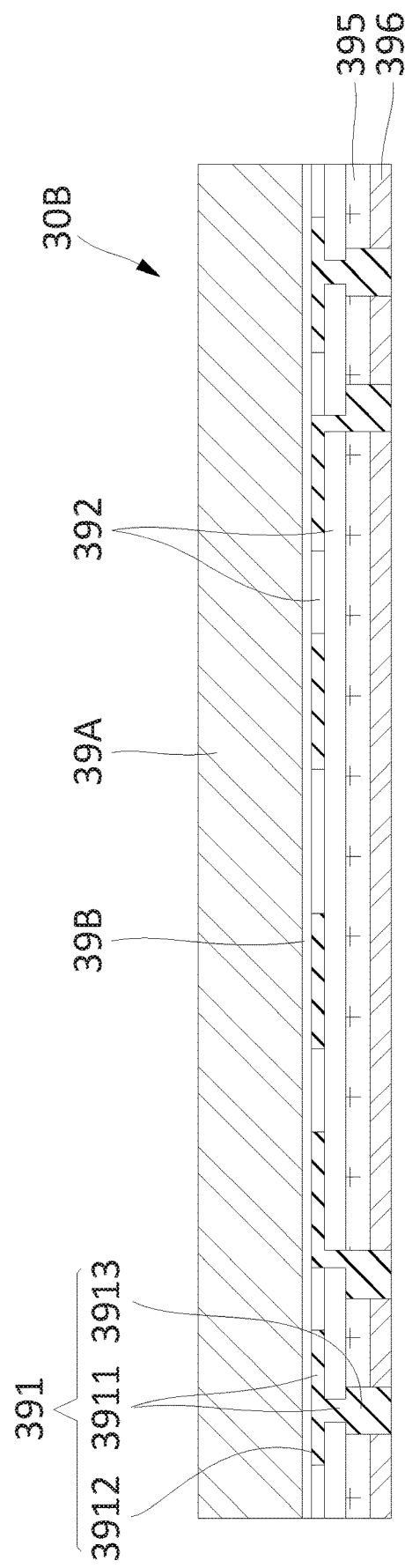
Figure 6P:
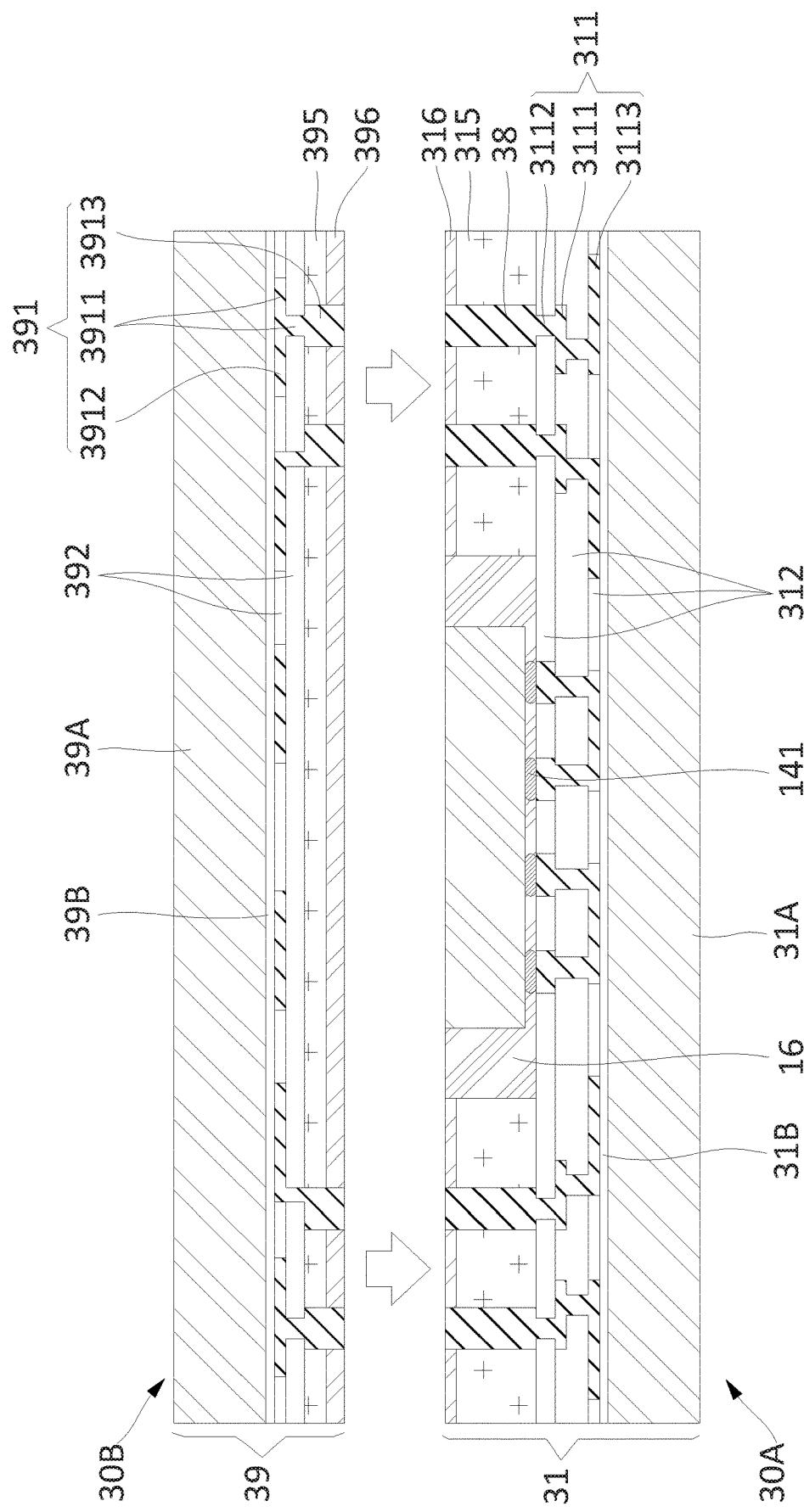
Figure 6Q:
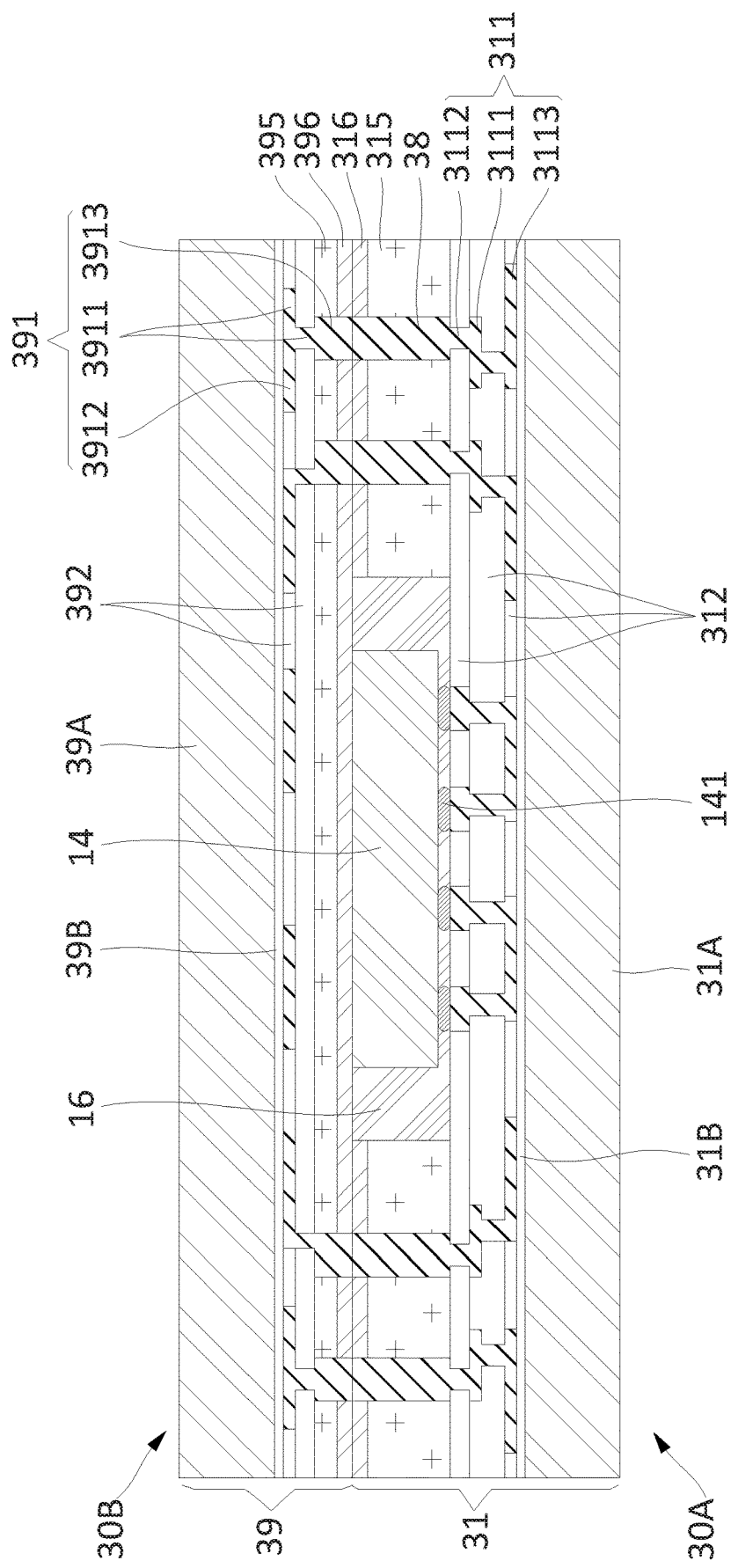

FIGS. 6A to 6Q show cross-sectional views of an example method for manufacturing an example semiconductor device 30. FIGS. 6A-6J show views of a method for manufacturing lower device portion 30A of semiconductor device 30. FIGS. 6K-6O show views of a method for manufacturing upper device portion 30B of semiconductor device 30. FIGS. 6P-6Q show views of a method to couple lower device portion 30A and upper device portion 30B to define semiconductor device 30.

FIG. 6A shows a cross-sectional view of semiconductor device 30 at an early stage of manufacture. In the example shown in FIG. 6A, planar body 315A can be provided. In some examples, body 315A can comprise a silicon material, a glass material, a ceramic material, or an inorganic material. In some examples, body 315A can be in the form of a wafer, a strip, or a panel.

FIG. 6B shows a cross-sectional view of semiconductor device 30 at a later stage of manufacture. In the example shown in FIG. 6B, openings can be formed in body 315A, and conductive structures, for example internal interconnects 38, can be positioned inside the openings. In some examples, high aspect ratio openings can be located in body 315A using a plasma etching process, a laser beam process or a chemical etching process. In some examples, openings can have an aspect ratio, such as a width to height ratio, in the range from approximately 1:10 to approximately 1:15. In some examples, openings can have a depth in the range from approximately 1 μm to approximately 20 μm. In some examples, the openings can have a width or a pitch or approximately 1 μm to approximately 20 μm. In some examples, openings can have a depth smaller than a thickness of body 315A.

In some examples, an insulation layer can be located on interior sides of openings, a seed layer can then be located on interior side of the insulation layer, and internal interconnects 38 can be formed or positioned on the interior side of the seed layer. In some examples, when body 315A is made of silicon, the insulation layer positioned inside openings can comprise a silicon oxide layer or a silicon nitride layer. In some examples, when body 315A is made of glass or ceramic, the insulation layer can comprise polyimide (PI), benzocyclobutene (BCB), or polybenzoxazole (PBO). In some examples, the insulation layer can have a thickness of approximately 0.1 µm to approximately 1 µm. In some examples, the seed layer can be provided using an electroless plating process, an electroplating process, or a sputtering process. In some examples, titanium tungsten (TiW) can first be deposited, and then copper (Cu) can then be electrolessly deposited on the TiW. The seed layer can have a thickness in the range from approximately 0.1 µm to approximately 1 µm. The seed layer can allow current to be distributed for the formation of internal interconnects 38 by electroplating. Internal interconnects 38 can be provided by plating copper (Cu), by plating nickel (Ni), by sequentially plating gold (Au) and copper (Cu), or by sequentially plating gold (Au) and nickel (Ni) on the seed layer. In some examples, internal interconnects 38 can be provided using electroplating equipment containing a copper (Cu) solution, a nickel (Ni) solution, or a gold (Au) solution. In some examples, after internal interconnects 38 are positioned in body 315A, top sides of body 315A and internal interconnects 38 can be planarized or subjected to grinding to allow top sides of body 315A and internal interconnects 38 to be coplanar. In some examples, internal interconnects 38 can comprise or can be referred to as pillars, vias, Through Silicon Vias (TSVs), or Through Glass Vias (TGVs). Internal interconnects 38 can have a line/space/thickness of approximately 0.5/0.5/0.5 µm to approximately 10/10/10 µm. In some examples, interconnects 1113 can have a line/space/thickness in the range from approximately 0.5/0.5/0.5 µm to approximately 10/10/10 µm.

FIG. 6C shows a cross-sectional view of semiconductor device 30 at a later stage of manufacture. In the example shown in FIG. 6C, conductive structure 311 and dielectric structure 312 can be provided on body 315A. A layer of dielectric structure 312 can be deposited on body 315A and internal interconnects 38. In some examples, the layer of dielectric structure 312 can be provided using a spin coating process or a spray coating process. In some examples, dielectric structure 312 can comprise or can be referred to as PI, BCB, or PBO. In some examples, the layer of dielectric structure 312 can have a thickness in the range from approximately 2 µm to approximately 20 µm.

In some examples, a patterned mask can be positioned on the layer of dielectric structure 312 and light can be irradiated on the mask. In some examples, such a photolithography process can be performed using stepper equipment. Patterned portions or non-patterned portions of the mask can be developed. Openings or patterns can be formed in the layer of dielectric structure 312, corresponding to the patterned mask, to expose internal interconnects 38 or portions of body 315A. The seed layer can be located on internal interconnects 38 positioned inside openings of dielectric structure 312, or on body 315A positioned inside openings of dielectric structure 312. Interconnects 3112 of conductive structure 311 can be formed on the seed layer over internal interconnects 38 or over exposed portions of body 315A. In some examples, interconnects 3112 can comprise or can be referred to as pads, lands, Under Bumped Metallizations (UBMs), or pillars. In some examples interconnects 3112 can be provided by plating copper (Cu) over internal interconnects 38, or over portions of body 315A, through openings of dielectric structure 312. In some examples, interconnects 3112 can have a line/space/thickness of approximately 0.5/0.5/0.5 µm to approximately 10/10/10 µm. In some examples, interconnects 3112 can be provided using electroplating equipment containing a copper (Cu) solution.

One or more other seed layers, dielectric layers of dielectric structure 312, or conductive layers of conductive structure 311, can be further provided in a similar manner to that described above to define dielectric structure 312, conductive paths 3111, and interconnects 3113. Conductive paths 3111 can comprise or can be referred to as traces, vias, or patterns. In addition, conductive paths 3111 can be generally positioned between dielectric layers of dielectric structure 312. Interconnects 3113 can comprise or can be referred to as pads, lands, Under Bumped Metallizations (UBMs), or pillars. Interconnects 3113 can be exposed through dielectric structure 312. In some examples, top sides of interconnects 3113 can be coplanar with a top side of dielectric structure 312. In some examples, bottom sides of interconnects 3112 can be coplanar with a bottom side of dielectric structure 312.

In some examples, conductive paths 3111 can electrically connect interconnects 3112 with interconnects 3113, and interconnects 3112 can electrically connect conductive paths 3111 with internal interconnects 38. In some examples, more or fewer layers of conductive structure 311 or of dielectric structure 312 can be provided. In some examples, multiple cavity substrate units can be formed on one single body 315A in forms of strips or arrays to enhance production efficiency for multiple semiconductor device 30.

FIG. 6D shows a cross-sectional view of semiconductor device 30 at a later stage of manufacture. In the example shown in FIG. 6D, carrier 31A can be attached to conductive structure 311 and dielectric structure 312. In some examples, carrier 31A can be attached using temporary adhesive 31B. In some examples, temporary adhesive 31B can lose its adhesiveness by heat or a laser beam. In some examples, temporary adhesive 31B can also be referred to as a release layer. Carrier 31A can comprise or can be referred to as silicon, glass, ceramic, or metal. Carrier 31A can support body 315A, conductive structure 311, and dielectric structure 312 and can prevent warpage during stages of manufacture.

FIG. 6E shows a cross-sectional view of semiconductor device 30 at a later stage of manufacture. In the example shown in FIG. 6E, a bottom side of body 315A can be thinned or planarized, such as by grinding. In some examples, as the bottom side of body 315A is thinned, ends of internal interconnects 38 can be exposed.

FIG. 6F shows a cross-sectional view of semiconductor device 30 at a later stage of manufacture, having been flipped from the view shown in FIG. 6E. In the example shown in FIG. 6F, body 315 comprises inner sidewalls that define cavity 315B. In some examples, a section of body 315 covering interconnects 3112 can be removed to define cavity 315B within body 315. In some examples, dry etching or wet etching can be employed in removing the such section of body 315. In some examples, plasma-state etching gas can be supplied to provide cavity 315B in body 315, for example a drying etching process). In some examples, nitric acid (HNO3), acetic acid (CH3COOH), or hydrofluoric acid (HF) solutions can be supplied to provide cavity 315B in body 315, for example via a wet etching process. Etching can be performed until dielectric structure 312 and conductive structure 311, for example interconnects 3112, are exposed from body 315. In some examples, cavity 315B can have a width equal to or greater than a width of electronic component 14.

FIG. 6G shows a cross-sectional view of semiconductor device 30 at a later stage of manufacture. In the example shown in FIG. 6G, electronic component 14 can be mounted inside cavity substrate 31. Electronic component 14 can be coupled with interconnects 3112 arranged inside cavity 315B through device interconnects 141.

In some examples, underfill 16 can be positioned between electronic component 14 and cavity substrate 31. In some examples, underfill 16 can fill the space between the bottom side of electronic component 14 and the top side of cavity 315B. In some examples, underfill 16 can fill the space between the lateral sides of electronic component 14 and the inner sidewalls of cavity 315B. In some examples, underfill 16 can be injected into cavity 315B after electronic component 14 is coupled with cavity substrate 31. In some examples, underfill 16 can be applied in cavity 315B in advance before electronic component 14 is connected to cavity substrate 31. In some examples, a top side of underfill 16 can be coplanar with top sides of electronic component 14 and body 315. In some examples, the top of electronic component 14 or the top of underfill 16 can protrude past the top of body 315. In examples where such protrusion initially happens, the tops of electronic component 14, of underfill 16, and of body 315 can be planarized to be coplanar, for example by a grinding process.

FIG. 6H shows a cross-sectional view of semiconductor device 30 at a later stage of manufacture. In the example shown in FIG. 6H, a wet or dry etching process can be performed to allow ends of internal interconnects 38 to protrude from body 315. Electronic component 14 and or underfill 16 can also protrude from the top side of body 315 due to such etching process.

FIG. 6I shows a cross-sectional view of semiconductor device 30 at a later stage of manufacture. In the example shown in FIG. 6I, interface dielectric 316 can be applied. In some examples, interface dielectric 316 can cover body 315, internal interconnects 38, electronic component 14, or portions of underfill 16. In some examples, interface dielectric 316 can be referred to as an insulation layer or a passivation layer. In some examples, interface dielectric 316 can comprise or can be referred to as a rigid inorganic material, for example silicon oxide or silicon nitride. In some examples, interface dielectric 316 can be provided by chemical vapor deposition (CVD), physical vapor deposition (PVD), atomic layer deposition (ALD), low pressure chemical vapor deposition (LPCVD), or plasma enhanced chemical vapor deposition (PECVD). In some examples, interface dielectric 316 can comprise or can be referred to as a soft organic material, such as for example, polyimide (PI), benzocyclobutane (BCB) or polybenzoxazole (PBO). In some examples, interface dielectric 316 can be provided using a spin coating process, a spray coating process, a dip coating process, or a rod coating process.

FIG. 6J shows a cross-sectional view of semiconductor device 30 at a later stage of manufacture. In the example shown in FIG. 6J, a planarization process can be performed. In some examples, an upper region of cavity substrate 31 can be planarized. In some examples, the planarization process can comprise or can be referred to as a chemical mechanical polishing (CMP) process or a fly-cutting process. In some examples, when interface dielectric 316 is made of an inorganic material, the CMP process can be used, and when interface dielectric 316 is made of an organic material, the flying-cut process can be used. In the CMP process, the inorganic material can be planarized by a rotating polishing pad and slurry, and in the fly-cutting process, the organic material is cut into bits to planarize its side.

In some examples, the planarization process can be performed by removing interface dielectric 316 until upper regions of internal interconnects 38, electronic component 14, or underfill 16 are exposed. Top sides of internal interconnects 38, electronic component 14, underfill 16, and interface dielectric 316 can be made coplanar. In some examples, interface dielectric 316 remaining after planarization can have a thickness of approximately 0.1 µm to approximately 10 µm. The structure shown in FIG. 6J can be referred to as lower device portion 30A of semiconductor device 30.

FIGS. 6K to 6O show a cross-sectional view of semiconductor device 30 at another stage of manufacture. In the example shown in FIGS. 6K-6O, a method to manufacture upper device portion 30B of semiconductor device 30 is presented. The processes shown in FIGS. 6K to 6O can be similar to those shown in FIGS. 6A to 6J for lower device portion 30A, except that no cavity exists in body 395 and electronic component 14 is not mounted. In some examples, the processes shown in FIGS. 6K to 6O can be first performed and the processes shown in FIGS. 6A to 6J can then be performed. In some examples, the processes shown in FIGS. 6K to 6O and the processes shown in FIGS. 6A to 6J can be simultaneously performed.

In some examples, the stage and elements shown in FIG. 6K for the formation of upper device portion 30B can be similar to corresponding stages or elements described above in FIGS. 6A-6D for the formation of lower device portion 30A. The stage shown in FIG. 6K, with body 395 supporting dielectric structure 392 and its one or more dielectric layers and conductive structure 391 and its conductive paths 3911, interconnects 3912, and interconnects 3913, can be reached, for example by a process similar to that described in FIGS. 6A-6D for respectively providing body 315A supporting dielectric structure 312 (and its one or more dielectric layers and conductive structure 311 and its conductive paths 3111, interconnects 3112, and interconnects 3113.

In some examples, the stage and elements shown in FIG. 6L for the formation of upper device portion 30B can be similar to corresponding stage or elements described above in FIG. 6E for the formation of lower device portion 30A. In some examples, the stage and elements shown in FIG. 6M for the formation of upper device portion 30B can be similar to corresponding stage or elements described above in FIG. 6H for the formation of lower device portion 30A.

In some examples, the stage and elements shown in FIG. 6N for the formation of upper device portion 30B can be similar to corresponding stage or elements described above in FIG. 6I for the formation of lower device portion 30A. In some examples, the stage and elements shown in FIG. 6O for the formation of upper device portion 30B can be similar to corresponding stage or elements described above in FIG. 6J for the formation of lower device portion 30A.

In the example shown in FIGS. 6K to 6O, carrier 39A can be coupled with substrate 39 through temporary adhesive 39B. Substrate 39 can comprise body 395, conductive structure 391, and dielectric structure 392. Interconnects 3913 of conductive structure 391 can extend or protrude into body 395. Conductive paths 3911 or interconnects 3912 of conductive structure 391 can be positioned inside dielectric structure 392. In some examples, more or fewer layers of conductive structure 391 or of dielectric structure 392 can be provided. Interface dielectric 396 can be located on bottom side of body 395. In some examples, interface dielectric 396 can be similar to interface dielectric 316 previously described in terms of material, structure, or method of formation. In some examples, bottom ends of interconnects 3913 can be coplanar with or exposed from the bottom side of interface dielectric 396.

FIGS. 6P to 6Q show a cross-sectional view of semiconductor device 30 at a later stage of manufacture. In the example shown in FIGS. 6P to 6Q, upper device portion 30B with substrate 39, and lower device portion 30A with cavity substrate 31, can be coupled to each other. In some examples, internal interconnects 38 of cavity substrate 31 and interconnects 3913 of substrate 39 can be coupled with each other. In some examples, interface dielectric 316 of cavity substrate 31 can be mechanically connected to interface dielectric 396 of substrate 39. In some examples, top side of electronic component 14 can be brought adjacent or into contact with interface dielectric 396 of substrate 39.

Prior to the connection process, plasma treatment can be performed. In some examples, exposed ends of internal interconnects 38 of cavity substrate 31 and interface dielectric 316 can be treated with plasma. In some examples, exposed ends of bottom interconnects 3913 of substrate 39 and interface dielectric 396 can be treated with plasma.

Thereafter, a soaking process can be performed. In some examples, cavity substrate 31 and substrate 39 can be soaked at a temperature in the range from approximately 50 degrees Celsius (° C.) to approximately 100° C. for approximately 1 minute to approximately 60 minutes.

Next, cavity substrate 31 and substrate 39 can be aligned to each other, and then internal interconnects 38 of cavity substrate 31 and interconnects 3913 of substrate 39 can be brought into contact with each other. In some examples, the soaking process can be performed during the contacting process. In some examples, thermal compression bonding process can then be performed. In some examples, an annealing process can be performed to firmly bond interconnects 3913 of substrate 39 with internal interconnects 38 of cavity substrate 31. In some examples, substrate 39 can be compressed onto cavity substrate 31 at a temperature of 100° C. to 250° C. to perform a temporary bonding process. In some examples, the annealing process can be performed at a temperature of 100° C. to 250° C., to secure the electrically connection or bottom interconnects 3913 of substrate 39 to internal interconnects 38 of cavity substrate 31. In some examples, interface dielectric 396 of substrate 39 can be in contact with interface dielectric 316 of cavity substrate 31.

In some examples, the connection between interconnects 3913 of substrate 39 and internal interconnects 38 of cavity substrate can be achieved without the use of solder. In some examples, a solderless interface region can be visually observed between internal interconnects 38 of cavity substrate 31 and bottom interconnects 3913 of substrate 39. In some examples, if internal interconnects 38 and bottom interconnects 3913 are thermally diffused sufficiently by the thermal compression process and the annealing, the interface region at their junction may be harder to be visually observed but can be detected spectroscopically.

Carrier 31A attached to cavity substrate 31 and carrier 39A attached to substrate 39 can be removed in a manner similar to that described above. In some examples, temporary adhesives 31B and 39B can also be removed. Bottom interconnects 3113 of cavity substrate 31 can be exposed, and top interconnects 3912 substrate 39 can also be exposed. External interconnects 12 can be connected to bottom interconnects 3113 of cavity substrate 31 in a manner similar to that described above, thereby completing semiconductor device 30.

In the processes shown in FIGS. 6A to 6Q, multiple units can be provided in forms of arrays in strips, wafers, or panels, which are finally separated into individual semiconductor devices 30 by sawing or singulation. In some examples, multiple lower device portions 30A can be provided in the form of an array and can be coupled with multiple upper device portions 30A in the form of arrays or strips. In some examples, multiple lower device portions 30A can be provided in the form of an array and can be coupled with individual upper device portions 30A. In some examples, multiple individual device portions 30A can be provided and can be coupled with multiple upper device portions 30A in form of array.

Figure 7:
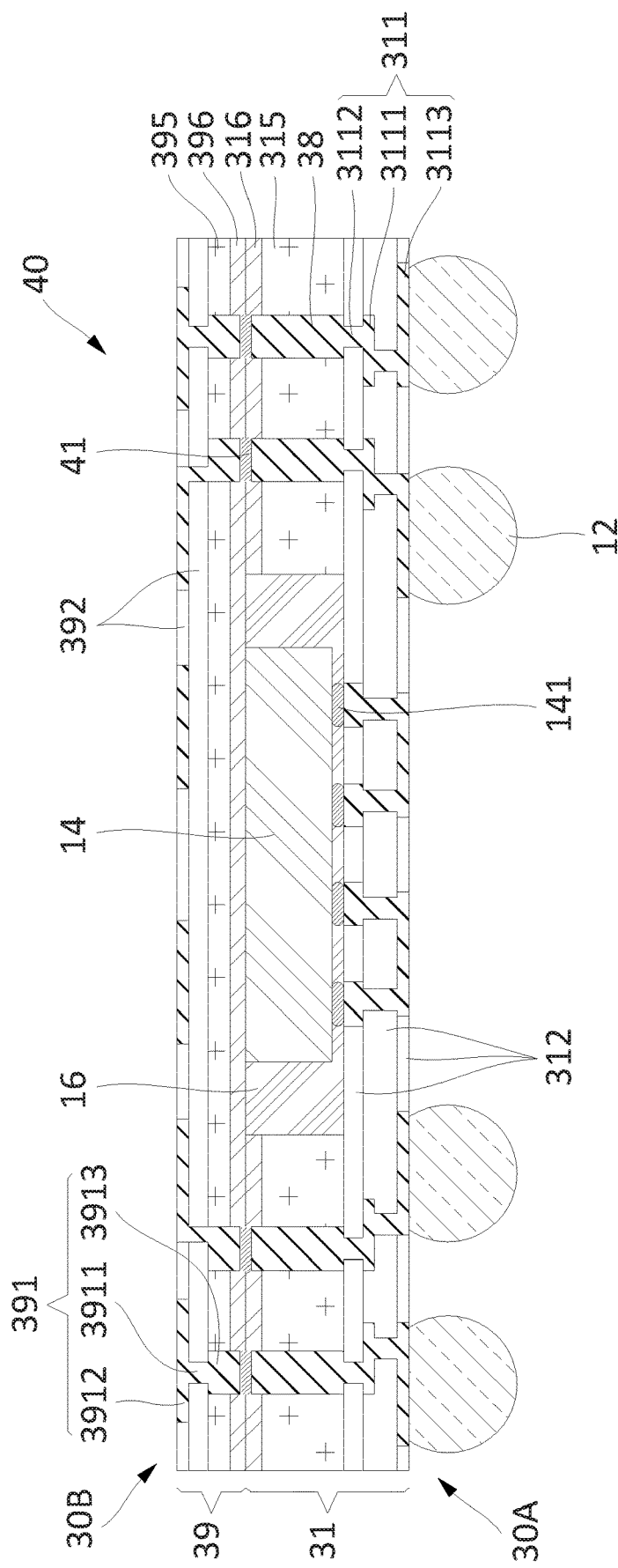
FIG. 7 shows cross-sectional views of an example method for manufacturing an example semiconductor device.

FIG. 7 shows cross-sectional views of an example method for manufacturing an example semiconductor device 40. In the example shown in FIG. 7, semiconductor device 40 can be similar to semiconductor device 30 shown in FIG. 5, and interconnecting material 41 is further provided. In some examples, interconnecting material 41 can be positioned between internal interconnects 38 of cavity substrate 31 and bottom interconnects 3913 of substrate 39. In some examples, interconnecting material 41 can comprise or can be referred to as solder, gold (Au) or silver (Ag). In some examples, interconnecting material 41 can have a thickness in the range from approximately 1 nanometer (nm) to approximately 2000 nm.

Interconnecting material 41 can increase interconnecting reliability between internal interconnects 38 of cavity substrate 31 and bottom interconnects 3913 of substrate 39 while lowering an interconnection process temperature. In some examples, lateral sides of interconnecting material 41 can be covered by interface dielectric 316 of cavity substrate 31 or interface dielectric 396 of substrate 39.

Figure 8:
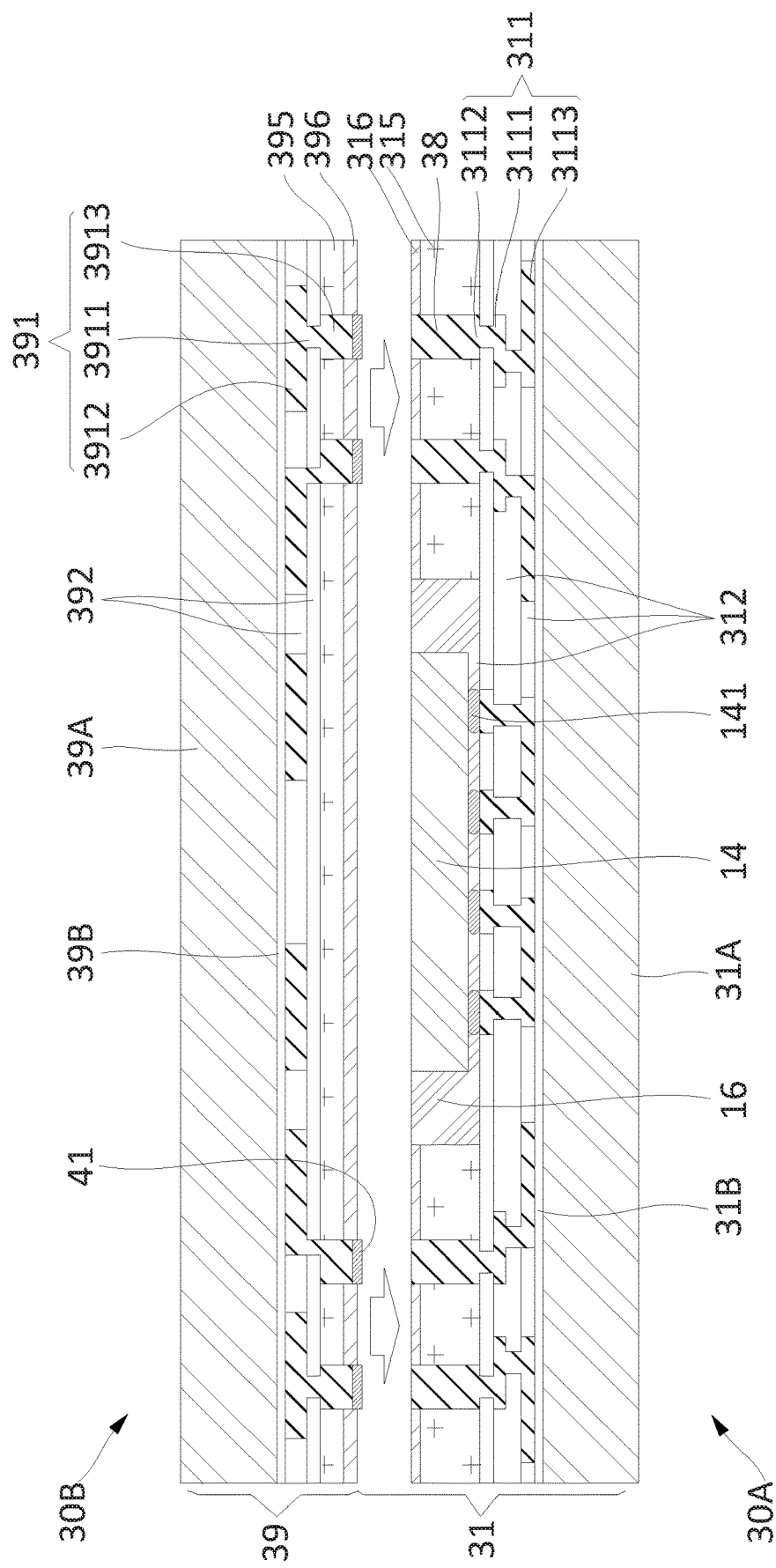
FIG. 8 shows cross-sectional view of an example method for manufacturing an example semiconductor device.

FIG. 8 shows cross-sectional view of an example method for manufacturing example semiconductor device 40. In the example shown in FIG. 8, interconnecting material 41 can be first applied to bottom interconnects 3913 of substrate 39 and then be connected to internal interconnects 38 of cavity substrate 31. Thereafter, a thermal compression bonding process, a mass reflow process, or a laser beam assist bonding process can be performed. Interconnecting material 41 shown in FIG. 8 can bond bottom interconnects 3913 with internal interconnects 38 at a temperature lower than the solderless metal-to-metal bonding temperature required for the example of semiconductor device 30 described with respect to FIGS. 5-6.

FIGS. 9A to 9D represent several options, based on the examples of FIGS. 5-8, for bonding between internal interconnects 38 of cavity substrate 31 and bottom interconnects 3913 of substrate 39. The following description will be made with representative examples of interface dielectrics 316 and 396 comprising several inorganic dielectrics or organic dielectrics, but other inorganic or organic dielectrics can be used. Internal interconnects 38 will be representatively described as comprising one or more metallic layers, but other conductors can be used. In addition, for better understanding, in the following discussion, cavity substrate 31 will be described with regard to only internal interconnects 38 and interface dielectric 316, and substrate 39 will be described with regard to only bottom interconnects 3913 and interface dielectric 396.

Figure 9B:
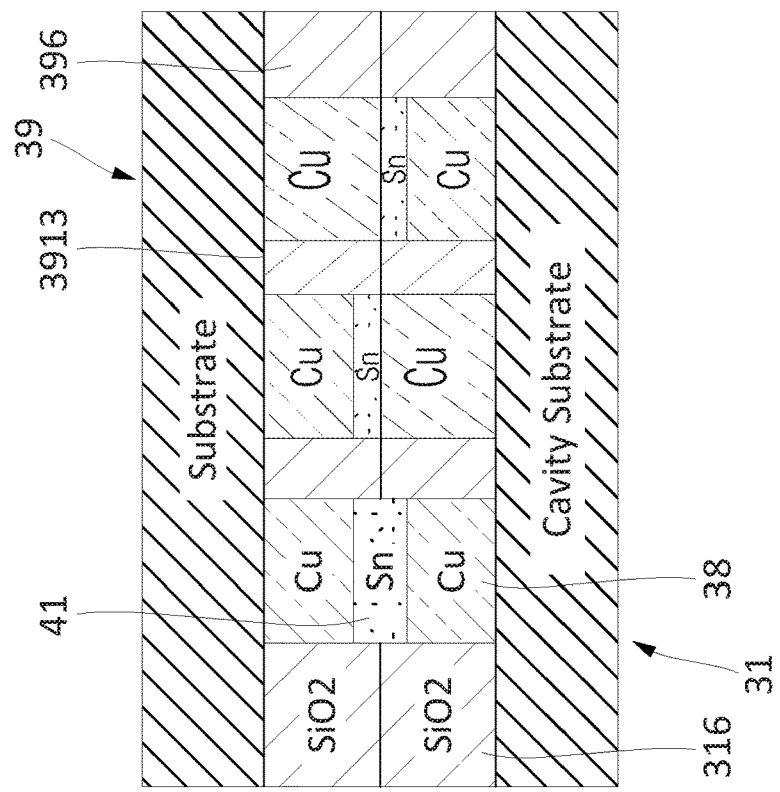
FIGS. 9A to 9D show cross-sectional views of an example structure for manufacturing an example semiconductor device.
Figure 9A:
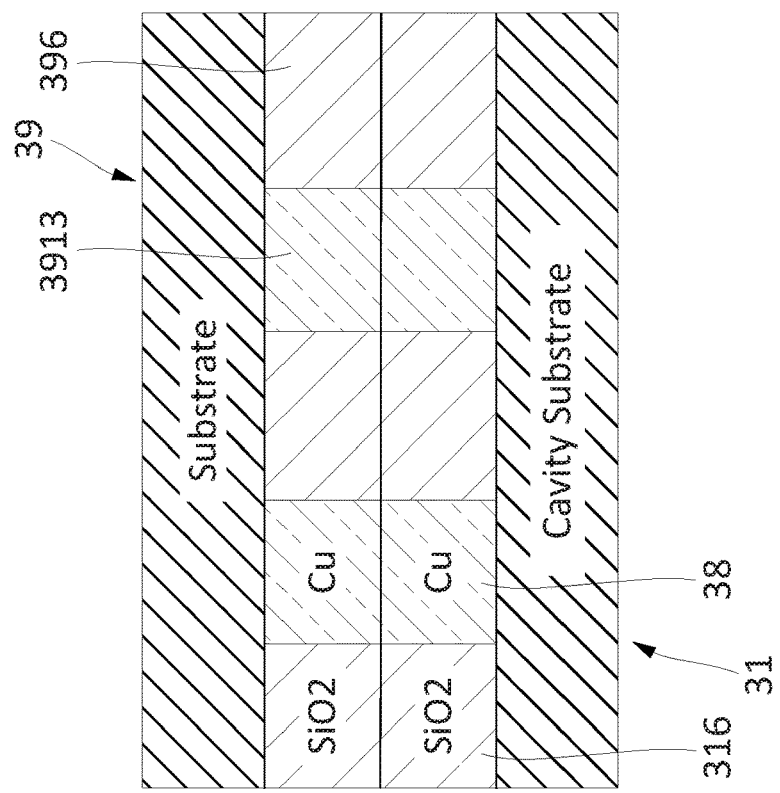

In the example shown in FIG. 9A, an example structure can employ silicon oxide as interface dielectric 316 of cavity substrate 31 and can employ copper as internal interconnects 38 of cavity substrate 31. An example structure can employ silicon oxide as interface dielectric 396 of substrate 39 and can employ copper as bottom interconnects 3913 of substrate 39. Copper employed for cavity substrate 31 and copper employed for substrate 39 can be directly bonded to each other using a solderless metal-to-metal bonding process, such as by annealing, and silicon oxide employed for cavity substrate 31 and silicon oxide employed for substrate 39 can be bonded to each other using, for example, a covalent bonding process by annealing. Because hard inorganic material such as silicon oxide is used as interface dielectrics 316 and 396, a CMP process can be used to achieve planarization. Such an example structure can have a high unit per hour (UPH) rate and can provide a stable bonding structure even at a cryogenic temperature.

In the example shown in FIG. 9B, the example structure can be similar to that shown in FIG. 9A, except that solder or tin (Sn) is positioned as interconnecting material 41 between internal interconnects 38 of cavity substrate 31 and bottom interconnects 3913 of substrate 39. Here, after planarization, for example using a CMP process, tin (Sn) can be immersion-plated on internal interconnects 38 of cavity substrate 31 or bottom interconnects 3913 of substrate 39, and can be positioned as interconnecting material 41 between internal interconnects 38 of cavity substrate 31 and bottom interconnects 3913 of substrate 39. Such thin deposition or plating of solder or tin (Sn) can assist in the bonding at lower temperature of internal interconnects 38 of cavity substrate 31 with bottom interconnects 3913 of substrate 39.

Figure 9D:
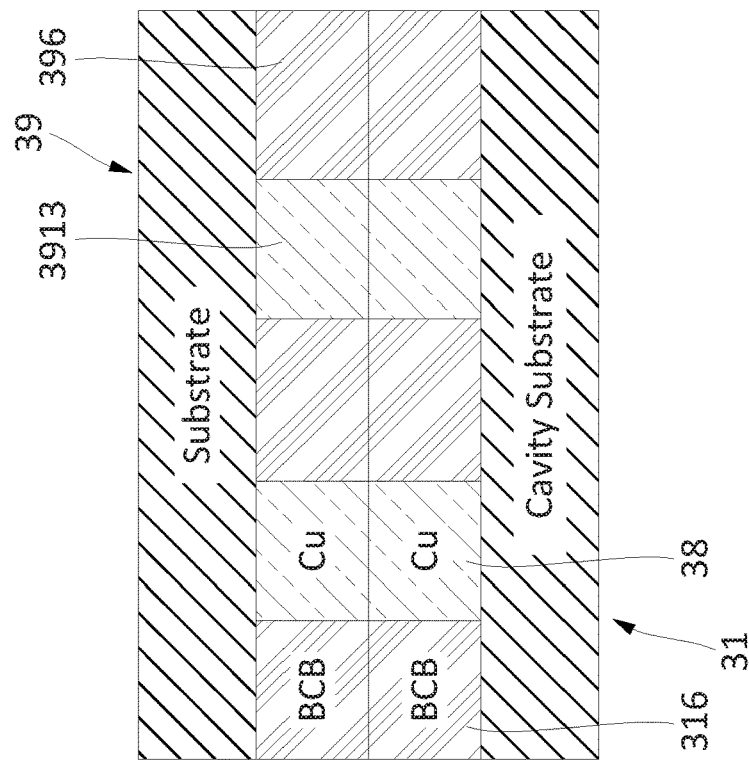
Figure 9C:
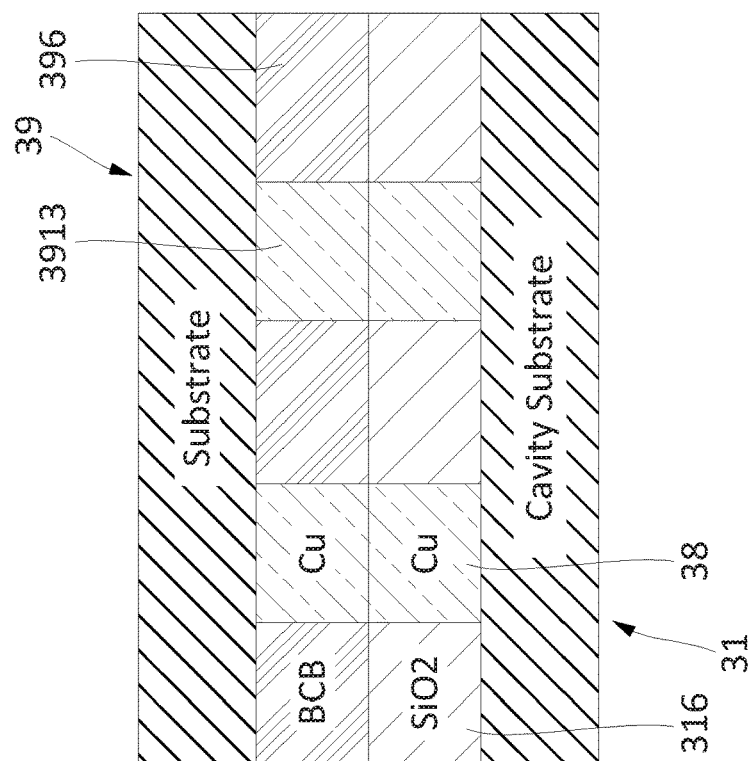

In the example shown in FIG. 9C, the example structure can be similar to that shown in FIG. 9A, except that organic dielectric such as benzocyclobutane (BCB) can be used as interface dielectric 396 of substrate 39. In such a manner, copper employed for cavity substrate 31 and copper employed for substrate 39 can be bonded to each other by a thermal compression bonding and annealing, and silicon oxide employed for cavity substrate 31 and BCB employed for substrate 39 can be bonded to each other by thermal compression bonding and annealing. Because a soft organic material such as BCB is used as interface dielectric 396 of substrate 39, a fly-cutting process can be used to achieve planarization. Because a hard inorganic material such as silicon oxide is used as interface dielectric 396, a CMP process can be used to achieve planarization. Such bonding processes using both of the inorganic material and the organic material can make example structure less sensitive to particles and can provide a high bonding force between cavity substrate 31 and substrate 39.

In the example shown in FIG. 9D, the example structure can be similar to that shown in FIG. 9C, except that organic dielectric such as benzocyclobutane (BCB) can be used as interface dielectric 316 of cavity substrate 31. In such a manner, copper employed for cavity substrate 31 and copper employed for substrate 39 can be interconnected by thermal compression bonding and annealing, and BCB employed for cavity substrate 31 and BCB employed for substrate 39 can be interconnected by thermal compression bonding and annealing. Because a soft organic material such as BCB is used as interface dielectrics 316 and 396 of cavity substrate 31, a fly-cutting process can be used to achieve side planarization.

FIGS. 10A to 10D represent several options, based on the examples of FIGS. 5-8, for bonding between internal interconnects 38 of cavity substrate 31 and bottom interconnects 3913 of substrate 39. The following description will be made with representative examples of interface dielectrics 316 and 396 comprising several inorganic dielectrics or organic dielectrics, but other inorganic or organic dielectrics can be used. Internal interconnects 38 will be representatively described as comprising one or more metallic layers, but other conductors can be used. In addition, for better understanding, in the following discussion cavity substrate 31 will be described with regard to only internal interconnects 38 and interface dielectric 316, and substrate 39 will be described with regard to only bottom interconnects 3913 and interface dielectric 396.

Figure 10B:
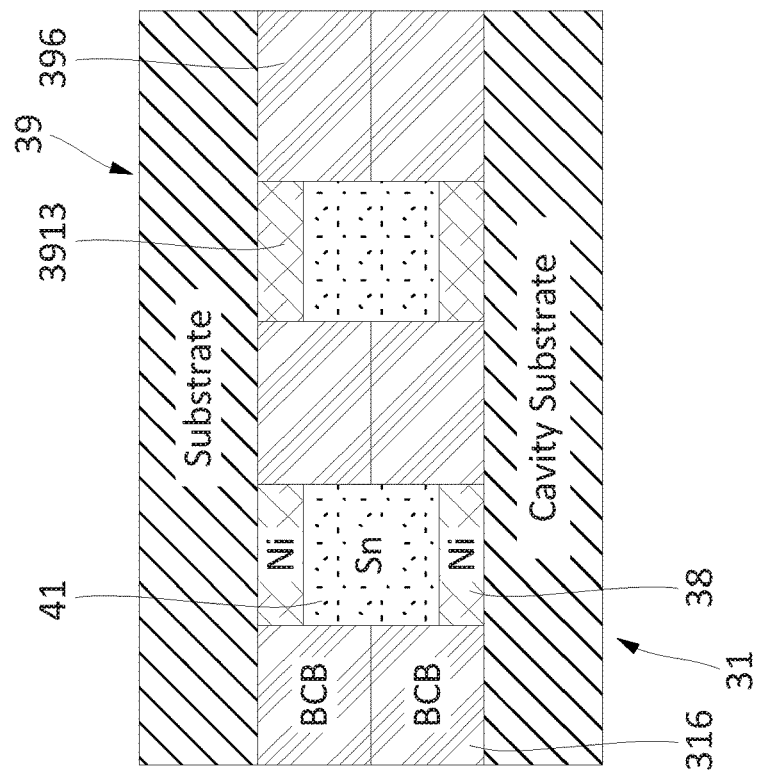
FIGS. 10A to 10D show cross-sectional views of an example structure for manufacturing an example semiconductor device.
Figure 10A:
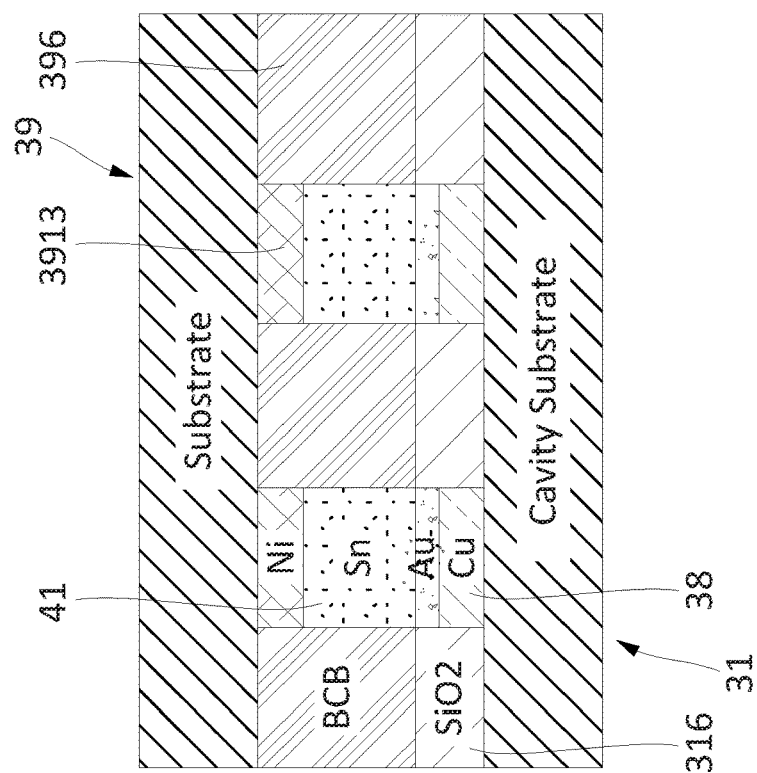

In the example shown in FIG. 10A, example structure can employ silicon oxide as interface dielectric 316 of cavity substrate 31 and can employ copper as internal interconnects 38 of cavity substrate 31. The example structure can further employ gold (Au) plated on internal interconnects 38 to increase wettability. In some examples, gold (Au) plating can have a thickness in the range from approximately 1 nm to approximately 10 nm. Example structure can employ BCB as interface dielectric 396 of substrate 39 or can employ nickel as bottom interconnects 3913 of substrate 39. Solder or tin (Sn) can be plated as interconnecting material 41. In some examples, solder or tin (Sn) plating can have a thickness in the range from approximately 2 μm to approximately 6 μm. Interconnect material 41 can be generally embedded in interface dielectric 396. In some examples, because a hard inorganic material such as silicon oxide is used as interface dielectric 316 of cavity substrate 31, a CMP process can be used to achieve planarization. Because a soft organic material such as BCB is used as interface dielectric 396 of substrate 39, a fly-cutting process can be used to achieve planarization. Internal interconnects 38 (Cu an Au) of cavity substrate 31 can be connected with bottom interconnects 3913 (Ni) of substrate 39 using interconnect material 41 such as solder or Sn.

In the example shown in FIG. 10B, the example structure can employ BCB as interface dielectric 316 of cavity substrate 31 and can employ nickel as bottom interconnects 3913 of cavity substrate 31 or as internal interconnects 38 of cavity substrate 31. Solder or tin (Sn) can be positioned as interconnecting material 41. Interconnect material 41 can be embedded in interface dielectric 316 of cavity substrate 31 or in interface dielectric 396 of substrate 39. In some examples, because a soft organic material such as BCB is used as interface dielectrics 316 and 396 for both of cavity substrate 31 and substrate 39, cavity substrate 31 and substrate 39 can be both planarized using a fly-cutting process. Internal interconnects 38 (Ni) of cavity substrate 31 can be connected to bottom interconnects 3913 (Ni) of substrate 39 using interconnect material 41, such as solder or Sn.

In the example shown in FIG. 10O, the example structure can be similar to that shown in FIG. 10A, except that polyimide (PI) can be used as interface dielectric 396 of substrate 39. Such an arrangement can make example structure less sensitive to particles or can provide a high bonding force between cavity substrate 31 and substrate 39.

Figure 10D:
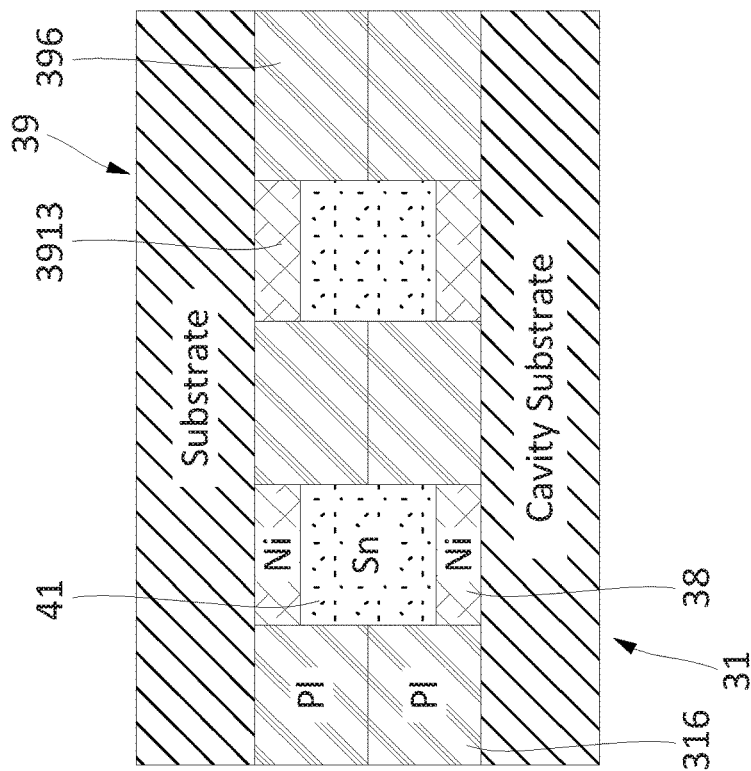
Figure 10C:
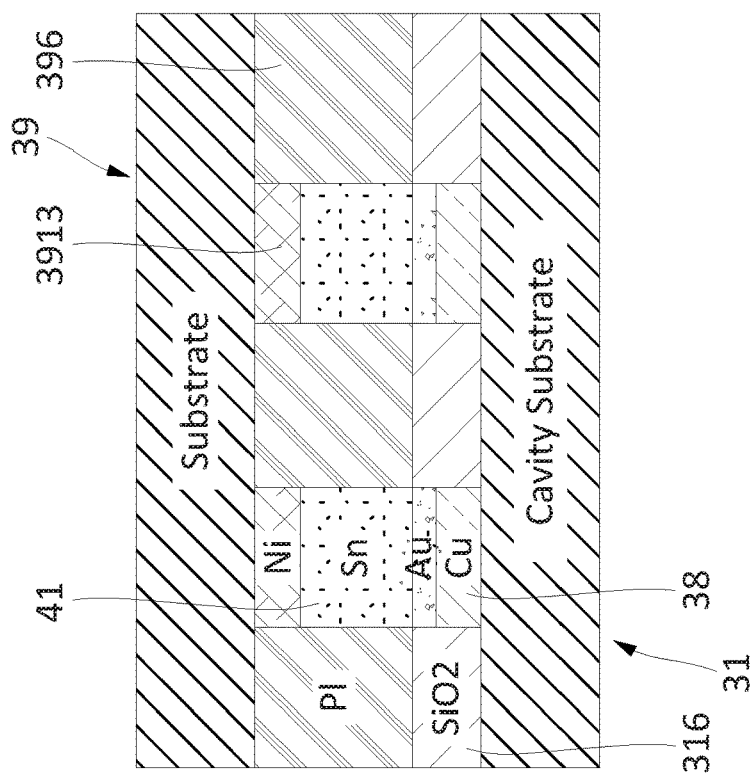

In the example shown in FIG. 10D, the example structure can be similar to that shown in FIG. 10B, except that polyimide (PI) can be used as both interface dielectric 316 of cavity substrate 31 and interface dielectric 396 of substrate 39. In such a manner, nickel of cavity substrate 31 and nickel of substrate 39 can be interconnected by thermal compression bonding, and PI of cavity substrate 31 and PI of substrate 39 can also be interconnected by thermal compression bonding.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
a first redistribution layer (RDL) substrate comprising:
a first dielectric structure; and
a first conductive structure through the first dielectric structure and comprising one or more first conductive redistribution layers;
an electronic component over the first RDL substrate, wherein the electronic component is coupled with the first conductive structure;
a body over a top side of the first RDL substrate, wherein the electronic component is in the body;
a second RDL substrate comprising:
a second dielectric structure over the body; and
a second conductive structure through the second dielectric structure and comprising one or more second conductive redistribution layers; and
an internal interconnect coupled between the first conductive structure and the second conductive structure;
wherein:
the first conductive structure comprises a conductive path comprising a trace and a downward via extending downward from the trace, wherein the downward via and the trace comprise a same metallic layer;
the second conductive structure comprises a conductive path comprising a trace and an upward via extending upward from the trace, wherein the upward via and the trace comprise a same metallic layer; and
the body directly contacts the first RDL substrate and directly contacts the second RDL substrate.

2. The semiconductor device of claim 1, further comprising an underfill between the electronic component and the top side of the first RDL substrate, and contacting a bottom side of the electronic component.

3. The semiconductor device of claim 1, wherein the body extends between a bottom side of the second RDL substrate and a top side of the electronic component.

4. The semiconductor device of claim 1, further comprising an adhesive between the electronic component and a bottom side of the second RDL substrate, wherein the adhesive covers a top side and a lateral side of the electronic component.

5. The semiconductor device of claim 1, wherein the first dielectric structure and the second dielectric structure are coreless.

6. The semiconductor device of claim 1, wherein the first RDL substrate is a cavity substrate comprising the body and inner sidewalls of the body defining a cavity and bounding the electronic component.

7. The semiconductor device of claim 6, wherein a gap is defined between one of the inner sidewalls of the body and a sidewall of the electronic component.

8. The semiconductor device of claim 1, wherein the internal interconnect comprises a metallic-core ball having a solder coating.

9. The semiconductor device of claim 1, wherein the internal interconnect comprises a pillar.

10. The semiconductor device of claim 1, further comprising an additional electronic component on a bottom side of the first RDL substrate, wherein the additional electronic component is coupled with the first conductive structure and comprises a resistor, a capacitor, an inductor, or a transistor.

11. A method to manufacture a semiconductor device, comprising:
providing a bottom substrate on a bottom carrier, wherein the bottom substrate comprises a first dielectric structure, a first conductive structure, and a top interconnect at a first side of the bottom substrate;
providing an electronic component over the bottom substrate, wherein the electronic component is coupled with the first conductive structure;
providing a top substrate on a top carrier, wherein the top substrate comprises a second dielectric structure, a second conductive structure, and a bottom interconnect on a first side of the top substrate;
providing an internal interconnect coupled with one of the top interconnect of the bottom substrate or the bottom interconnect of the top substrate;
providing the top substrate over the bottom substrate, wherein the top substrate is inverted with respect to the bottom substrate;
coupling the internal interconnect to another one of the top interconnect of the bottom substrate or the bottom interconnect of the top substrate;
providing a body between the bottom substrate and the top substrate, wherein the electronic component is in the body;
removing the top carrier and the bottom carrier; and
singulating through the top substrate, the bottom substrate, and the body;
wherein the body is provided after said coupling and prior to removing the top carrier and the bottom carrier, and the body contacts the top substrate and the bottom substrate.

12. The method of claim 11, comprising, prior to removing the top carrier:
removing the bottom carrier; and
providing an external interconnect on a bottom side of the bottom substrate and coupled with the first conductive structure.

13. The method of claim 11, comprising providing an adhesive between a top side of the electronic component and the first side of the top substrate prior to providing the body.

14. A method to manufacture a semiconductor device, comprising:
providing a bottom substrate on a bottom carrier, wherein the bottom substrate comprises a first dielectric structure, a first conductive structure, and a top interconnect at a first side of the bottom substrate;
providing an electronic component over the bottom substrate, wherein the electronic component is coupled with the first conductive structure;
providing a top substrate on a top carrier, wherein the top substrate comprises a second dielectric structure, a second conductive structure, and a bottom interconnect on a first side of the top substrate;
providing an internal interconnect coupled with one of the top interconnect of the bottom substrate or the bottom interconnect of the top substrate;
singulating through the top substrate and the top carrier to define a first top substrate unit;
providing the first top substrate unit over the electronic component and over the bottom substrate;
coupling the internal interconnect with another one of the top interconnect of the bottom substrate or the bottom interconnect of the top substrate;
providing a body between the bottom substrate and the first top substrate unit, wherein the electronic component is in the body, and wherein the body covers a periphery of the first top substrate unit;
removing the top carrier and the bottom carrier; and
singulating the first top substrate unit, the bottom substrate, and the body;

wherein the body is provided after said coupling and prior to removing the top carrier and the bottom carrier, and the body contacts the top substrate and the bottom substrate.

15. The method of claim 14, comprising:
prior to removing the bottom carrier,
removing the top carrier from the first top substrate unit; and
providing an additional carrier over the first top substrate unit;
after removing the bottom carrier;
providing an external interconnect on a bottom side of the bottom substrate; and
removing the additional carrier prior to performing singulating of the first top substrate unit, the bottom substrate, and the body.

16. The method of claim 14, comprising providing an additional electronic component on a bottom side of the bottom substrate, wherein the additional electronic component is coupled with the first conductive structure.

17. The method of claim 14, wherein:
singulating the first top substrate unit, the bottom substrate, and the body comprises:
partially sawing along the periphery of the first top substrate unit, and then singulating through the body and the bottom substrate.

18. A semiconductor device, comprising:
a first redistribution layer (RDL) substrate comprising:
a first dielectric structure; and
a first conductive structure through the first dielectric structure and comprising one or more first conductive redistribution layers;
an electronic component over the first RDL substrate, wherein the electronic component is coupled with the first conductive structure;
a body over a top side of the first RDL substrate, wherein the electronic component is in the body;
a second RDL substrate comprising:
a second dielectric structure over the body; and
a second conductive structure through the second dielectric structure and comprising one or more second conductive redistribution layers; and
an internal interconnect coupled between the first conductive structure and the second conductive structure;
wherein:
the first conductive structure comprises a conductive path comprising a trace and a downward via extending downward from the trace;
the second conductive structure comprises a conductive path comprising a trace and an upward via extending upward from the trace;
the body directly contacts the first RDL substrate and directly contacts the second RDL substrate; and
the first RDL substrate is a cavity substrate comprising the body and inner sidewalls of the body defining a cavity and bounding the electronic component.

19. The semiconductor device of claim 18, wherein a gap is defined between one of the inner sidewalls of the body and a sidewall of the electronic component.

20. The semiconductor device of claim 19, further comprising an underfill in the gap.

* * * * *